(12) United States Patent
Yoshitaka et al.

(10) Patent No.: US 9,165,758 B2
(45) Date of Patent: Oct. 20, 2015

(54) PEELING SYSTEM, PEELING METHOD, AND COMPUTER STORAGE MEDIUM

(75) Inventors: Naoto Yoshitaka, Koshi (JP); Yasuharu Iwashita, Koshi (JP); Masataka Matsunaga, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 124 days.

(21) Appl. No.: 13/978,345

(22) PCT Filed: Dec. 26, 2011

(86) PCT No.: PCT/JP2011/080048
§ 371 (c)(1),
(2), (4) Date: Jul. 3, 2013

(87) PCT Pub. No.: WO2012/093610
PCT Pub. Date: Dec. 7, 2012

(65) Prior Publication Data
US 2013/0280825 A1  Oct. 24, 2013

(30) Foreign Application Priority Data
Jan. 7, 2011 (JP) .................................. 2011-002561

(51) Int. Cl.
| | |
|---|---|
| B32B 38/10 | (2006.01) |
| H01L 21/02 | (2006.01) |
| H01L 21/67 | (2006.01) |
| H01L 21/687 | (2006.01) |
| B32B 43/00 | (2006.01) |

(52) U.S. Cl.
CPC .... *H01L 21/02002* (2013.01); *H01L 21/67051* (2013.01); *H01L 21/67092* (2013.01);
(Continued)

(58) Field of Classification Search
CPC  B32B 38/10; B32B 43/006; Y10T 156/1944; Y10T 156/1132

USPC .......... 156/701, 708, 750, 757, 930, 941, 942
See application file for complete search history.

(56) References Cited

U.S. PATENT DOCUMENTS

| | | | | |
|---|---|---|---|---|
| 5,570,994 | A | * | 11/1996 | Somekh et al. ............... 414/217 |
| 5,934,856 | A | * | 8/1999 | Asakawa et al. .............. 414/217 |

(Continued)

FOREIGN PATENT DOCUMENTS

| | | |
|---|---|---|
| JP | 9-167724 A | 6/1997 |
| JP | 09199569 A | 7/1997 |

(Continued)

*Primary Examiner* — Philip Tucker
*Assistant Examiner* — Nickolas Harm
(74) *Attorney, Agent, or Firm* — Nath, Goldberg & Meyer; Jerald L. Meyer

(57) ABSTRACT

A peeling system includes: a carry-in/carry-out station that loads/unloads substrates to be processed, support substrates, or stacked substrates in which these are made to adhere; a peeling process station that carries out prescribed processing on substrates to be processed, support substrates and stacked substrates; and a transport station provided between the carry-in/carry-out station and the peeling process station. The peeling process station has a peeling device that peels the stacked substrates, a first washing apparatus that washes peeled substrates to be processed, and a second washing apparatus that washes the peeled support substrates. The pressure inside the transport station is a positive pressure in relation to the pressure inside the peeling device, the pressure inside the first washing apparatus, and the pressure inside the second washing apparatus. The pressure inside a transport apparatus is a positive pressure in relation to the pressure inside the peeling device and the pressure inside the first washing apparatus.

19 Claims, 13 Drawing Sheets

(52) U.S. Cl.
CPC .... *H01L21/67103* (2013.01); *H01L 21/68728* (2013.01); *B32B 38/10* (2013.01); *B32B 43/006* (2013.01); *Y10T 156/1132* (2015.01); *Y10T 156/19* (2015.01); *Y10T 156/1944* (2015.01)

(56) References Cited

U.S. PATENT DOCUMENTS

| | | | |
|---|---|---|---|
| 6,672,358 B2 * | 1/2004 | Yanagita et al. | 156/750 |
| 6,698,486 B2 * | 3/2004 | Goh | 156/444 |
| 2008/0093025 A1 * | 4/2008 | Yamamoto et al. | 156/378 |
| 2009/0139662 A1 * | 6/2009 | Nakamura et al. | 156/584 |
| 2009/0202951 A1 * | 8/2009 | Yamamoto et al. | 430/322 |

FOREIGN PATENT DOCUMENTS

| | | |
|---|---|---|
| JP | 2000-158332 A | 6/2000 |
| JP | 2004-266071 A | 9/2004 |
| JP | 2006-303012 A | 11/2006 |
| JP | 2007173364 A | 7/2007 |
| JP | 2010-003748 A | 1/2010 |

* cited by examiner

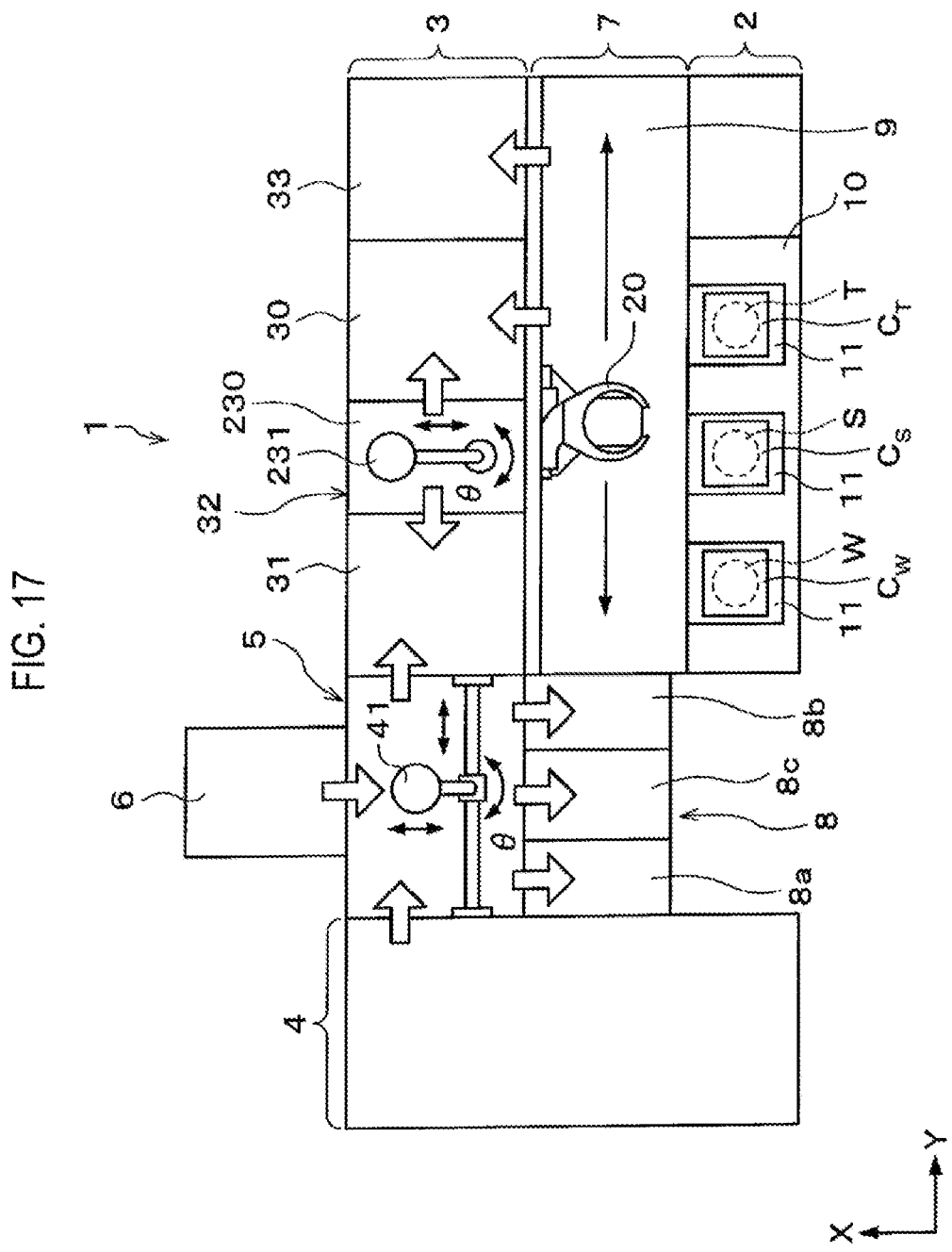

PEELING SYSTEM, PEELING METHOD, AND COMPUTER STORAGE MEDIUM

TECHNICAL FIELD

The present disclosure relates to a peeling system which peels off a substrate to be processed and a support substrate from an overlapped substrate, a peeling method using the peeling system, and a computer storage medium.

BACKGROUND

In recent years, for example, the diameter of semiconductor wafers (hereinafter, referred to as "wafers") are increasing. In addition, there is a desire to make the wafers thin in a specified process such as mounting or the like. However, a large-diameter thin wafer is likely to be bent or cracked if the wafer is transferred or polished as is. Therefore, in order to reinforce the wafer, the wafer is bonded to, for example, a wafer or a glass substrate that acts as a support substrate. Thereafter, a predetermined process such as a polishing process is performed on the wafer in a state where the wafer is bonded to the support substrate as described above, and subsequently, the wafer and the support substrate are peeled off from each other.

Such a peeling is performed, for example, using a peeling device. For example, the peeling device includes a first holder for holding the wafer, a second holder for holding the support substrate, and a nozzle for injecting liquid between the wafer and the support substrate. In the peeling device, the nozzle injects liquid between the wafer and the support substrate which are bonded together at an injection pressure. The injection pressure is greater than a bonding strength applied in bonding the wafer and the support substrate, preferably, at an injection pressure that is two or more times stronger than the bonding strength, thus peeling the wafer and the support substrate (see Patent Document 1).

PRIOR ART DOCUMENT

Patent Document

Patent Document 1: Japanese Laid-open Patent Publication H9-167724

After the wafer and the support substrate are peeled off from each other as described above, each of the bonding surfaces of the wafer and the support substrate is cleaned, and the peeling process is ended.

However, in the peeling device, since the wafer and the support wafer which are not subject to the cleaning are handled, contaminants generated in the course of the peeling process adhere to the interior of the peeling device, creating particles in the peeling device.

In addition, the particles generated from the peeling device may spread outside of the peeling device increasing a particle generation source. As a result, for example, the wafer may be contaminated by particles before the peeling process, which may cause defects in the course of processing the wafer.

SUMMARY

The present disclosure has been made in consideration of the above points, and in some embodiments, particles are prevented from being generated when a peeling device peels off a substrate to be processed from a support substrate, and also particles are prevented from being spread outside of the peeling device.

One embodiment is a peeling system for peeling off a substrate to be processed and a support substrate from an overlapped substrate. The overlapped substrate is formed by bonding the substrate to be processed and the support substrate by an adhesive. The peeling system includes a peeling process station configured to perform a predetermined process on the substrate to be processed, the support substrate and the overlapped substrate; a carry-in/carry-out station configured to carry at least one of the substrate to be processed, the support substrate and the overlapped substrate in and out of the peeling process station; and a transfer station configured to transfer the at least one of the substrate to be processed, the support substrate and the overlapped substrate between the peeling process station and the carry-in/carry-out station, wherein the peeling process station includes: a peeling device configured to peel off the substrate to be processed and the support substrate from the overlapped substrate; a first cleaning device configured to clean the substrate to be processed which is peeled by the peeling device; a second cleaning device configured to clean the support substrate which is peeled by the peeling device; and a transfer device configured to transfer the cleaned substrate to be processed between the peeling device and the first cleaning device, wherein a pressure within the transfer station is higher than a pressure within the peeling device, a pressure within the first cleaning device and a pressure within the second cleaning device, and wherein a pressure within the transfer device is higher than the pressure within the peeling device and the pressure within the first cleaning device.

According to the peeling system of the present disclosure, the pressure within the transfer station is higher than the pressure within the peeling device, which causes a gas flow which is oriented from the transfer station to the peeling device. In addition, the pressure within the transfer unit is higher than the pressure within the peeling device, which causes a gas flow from the transfer unit to the peeling device. In other words, no atmosphere is discharged from the peeling device to the outside. Therefore, no particles are discharged from the peeling device to the outside. This makes it possible to prevent the particles generated when the substrate to be processed and the support substrate are peeled off from each other from being spread to the outside of the peeling device.

The present disclosure according to another aspect is a method of peeling off a substrate to be processed and a support substrate from an overlapped substrate using a peeling system, the overlapped substrate being formed by bonding the substrate to be processed and the support substrate by an adhesive, wherein the peeling system includes: a peeling process station provided with: a peeling device configured to peel off the substrate to be processed and the support substrate from the overlapped substrate; a first cleaning device configured to clean the substrate to be processed which is peeled by the peeling device; and a second cleaning device configured to clean the support substrate which is peeled by the peeling device; a carry-in/carry-out station configured to carry at least one of the substrate to be processed, the support substrate and the overlapped substrate in and out the peeling process station; and a transfer station configured to transfer the at least one of the substrate to be processed, the support substrate and the overlapped substrate between the peeling process station and the carry-in/carry-out station, the method comprising: peeling, by the peeling device, the substrate to be processed and the support substrate from the overlapped substrate; cleaning, by the first cleaning device, the substrate to be processed which is peeled by the peeling process; and cleaning, by the second cleaning device, the support substrate which is peeled by the peeling process, wherein a pressure within the transfer station is higher than a pressure within the peeling device, a pressure within the first cleaning device and a pressure within the second cleaning device, and wherein a pressure within the transfer device is higher than the pressure within the peeling device and the pressure within the first cleaning device.

The present disclosure according to still another aspect is a computer readable storage medium having a control program operating on a computer stored thereon, wherein the control program, when executed, causes the computer to perform the peeling method using the peeling system.

Effects of the Present Disclosure

According to the present disclosure, it is possible to prevent particles that are generated when a substrate to be processed and a support substrate are peeled off from each other by a peeling process from being spread to the outside of a peeling device.

BRIEF DESCRIPTION OF THE DRAWINGS

FIG. 17 is a view showing a modified example of the peeling system of FIG. 8.

DETAILED DESCRIPTION

Figure 1:
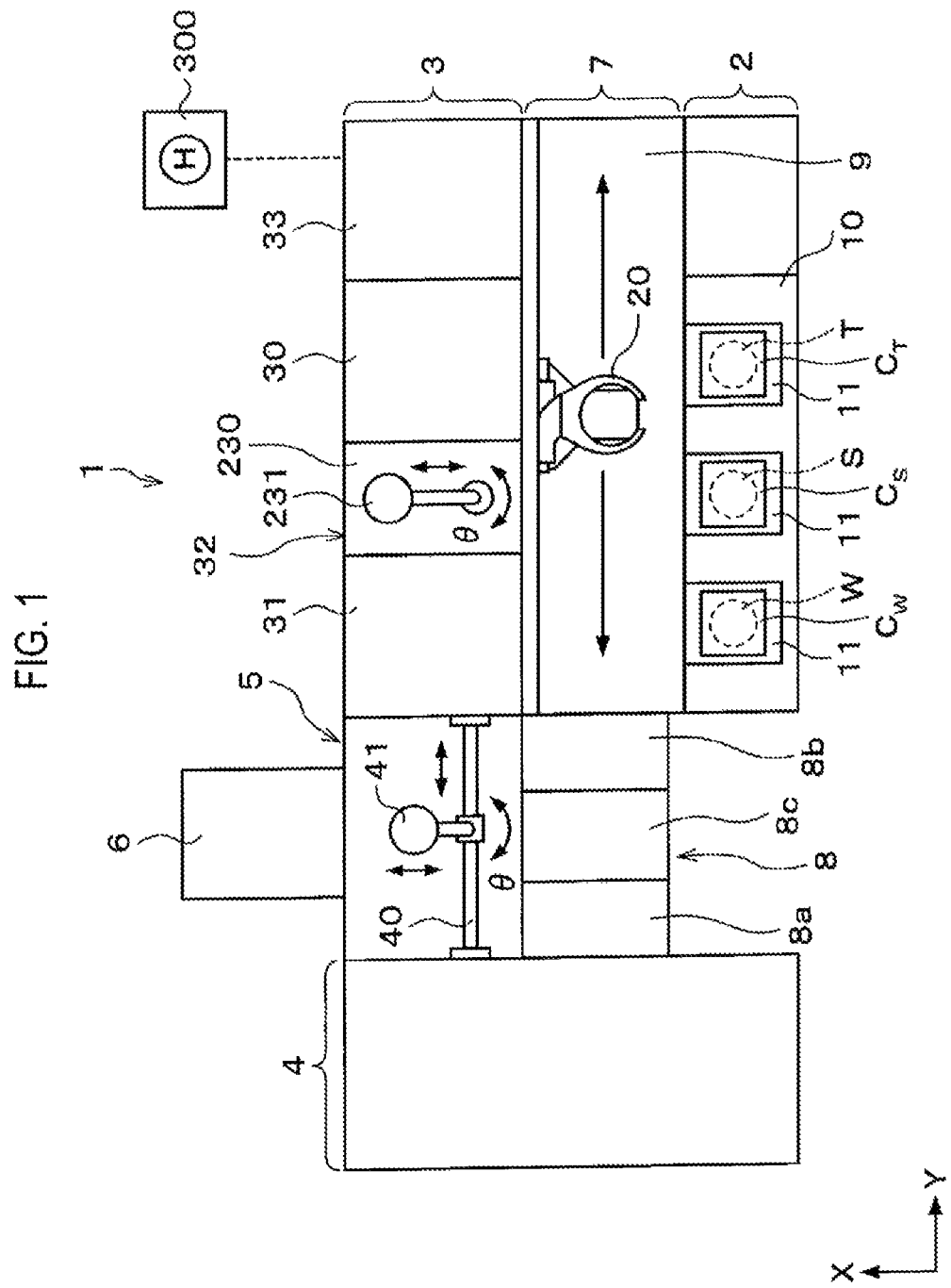
FIG. 1 is a plane view schematically showing the configuration of a peeling system according to an embodiment of the present disclosure.

Hereinafter, embodiments of the present disclosure will be described. FIG. 1 is a plane view schematically showing a configuration of a peeling system 1 according to an embodiment.

Figure 2:
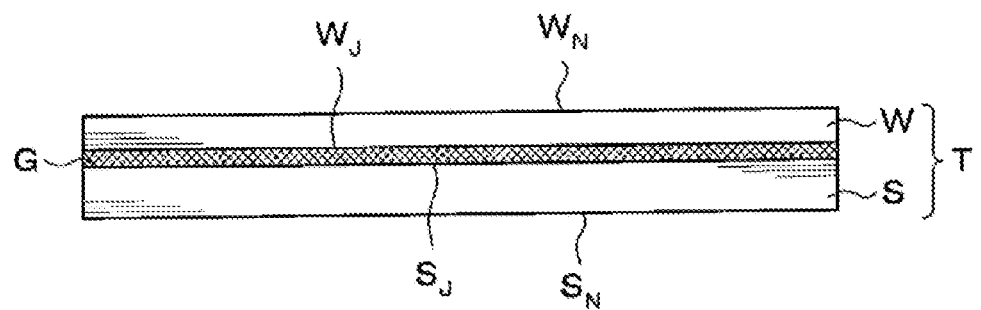
FIG. 2 is a lateral view of a wafer to be processed and a support wafer.

In the peeling system 1, an overlapped wafer T as an overlapped substrate which is formed by bonding a wafer to be processed W as a substrate to be processed and a support wafer S as a support substrate by an adhesive G as shown in FIG. 2, is separated into the wafer to be processed W and the support wafer S. Hereinafter, in the wafer to be processed W, a surface to be bonded to the support wafer S through the adhesive G will be referred to as a "bonding surface $W_J$," and a surface to be opposite to the bonding surface $W_J$ will be referred to as a "non-bonding surface $W_N$." Similarly, in the support wafer S, a surface to be bonded to the wafer to be processed W through the adhesive G will be referred to as a "bonding surface $S_J$," and a surface to be opposite to the bonding surface $S_J$ will be referred to as a "non-bonding surface $S_N$." In addition, the wafer to be processed W is a wafer to be used as a product. A plurality of electronic circuits are formed on, e.g., the bonding surface $W_J$ of the wafer to be processed W. Further, for example, the non-bonding surface $W_N$ of the wafer to be processed W is subjected to a polishing so that a thickness thereof becomes thin (by, e.g., 50 µm). The support wafer S has the same diameter as that of the wafer to be processed W and supports the wafer to be processed W. While in this embodiment, the wafer has been described to be used as the support substrate, the present disclosure is not limited thereto. For example, another substrate such as a glass substrate may be used as the support substrate.

As shown in FIG. 1, the peeling system 1 includes a carry-in/carry-out station 2 in which cassettes $C_W$, $C_S$ and $C_T$ are carried in and out between the carry-in/carry-out station 2 and the outside, a peeling process station 3 including various processing units which are configured to perform a predetermined process on the wafers to be processed W, the support wafers S and the overlapped wafers T, an interface station 5 configured to deliver the wafers to be processed W between the peeling process station 3 and a post-treatment station 4 disposed adjacent thereto, and an inspection device 6 configured to inspect the wafers to be processed W before they are delivered to the post-treatment station 4. These stations 2, 3, 4, 5 and 6 are connected serially. The cassettes $C_W$, $C_S$ and $C_T$ are configured to accommodate a plurality of wafers to be processed W, a plurality of support wafers S, and a plurality of overlapped wafers T therein, respectively.

The carry-in/carry-out station 2 and the peeling process station 3 are arranged in a line along an X-axis direction (vertical direction in FIG. 1). A transfer station 7 is provided between the carry-in/carry-out station 2 and the peeling process station 3. The interface station 5 is disposed at the backward side of the peeling process station 3 along a Y-axis direction (at the left side in FIG. 1). In addition, the inspection device 6 is disposed at the forward side of the interface station 5 in the X-axis direction (the upside in FIG. 1). A cleaning device 8, which is configured to clean the wafers to be processed W after the inspection, is disposed opposite to the inspection device 6 with the interface station 5 interposed therebetween, i.e., at the backward side of the interface station 5 in the X-axis direction.

A cassette loading table 10 is disposed in the carry-in/carry-out station 2. A plurality of, e.g., three, cassette loading plates 11 are disposed in the cassette loading table 10. The cassette loading plates 11 are arranged in a line along the Y-axis direction (the left and right direction in FIG. 1). The cassette loading plates 11 can load thereon the cassettes $C_W$, $C_S$ and $C_T$ when they are carried in and out between the carry-in/carry-out station 2 and the outside of the peeling system 1, respectively. In this way, the carry-in/carry-out station 2 can hold the plurality of wafers to be processed W, the plurality of support wafers S, and the plurality of overlapped wafers T. In addition, the number of the cassette loading plates 11 is not limited to this embodiment but may be selected as appropriate. Further, the plurality of overlapped wafers T loaded in the carry-in/carry-out station 2 are inspected in advance so that they are distinguished as a normal overlapped wafer including a normal wafer to be processed W and an abnormal overlapped wafer including an abnormal wafer to be processed W.

A transfer mechanism 20 is disposed in a wafer transfer region 9 which is defined inside the transfer station 7. The transfer mechanism 20 is equipped with a transfer arm, which is movable in vertical and horizontal directions (the Y and X-axis directions), and is rotatable around the vertical axis. The transfer mechanism 20 moves inside the wafer transfer region 9 to transfer the wafer to be processed W, the support wafer S, and the overlapped wafer T between the carry-in/carry-out station 2 and the peeling process station 3. A gas flow, oriented vertically downward and referred to as a downflow, is generated inside the transfer station 7, i.e., in the wafer transfer region 9. In addition, an internal atmosphere of the wafer transfer region 9 is exhausted through an exhaust port (not shown).

The peeling process station 3 includes a peeling device 30 configured to peel off the wafer to be processed W and the support wafer S from the overlapped wafer T. A first cleaning device 31 configured to clean the wafer to be processed W which has been peeled off, is disposed at the backward side of the peeling device 30 along the Y-axis direction (at the left side in FIG. 1). A transfer unit 32 is provided between the peeling device 30 and the first cleaning device 31. Further, a second cleaning device 33 configured to clean the support wafer S which has been peeled off, is disposed at the forward side of the peeling device 30 in the Y-axis direction (at the right side in FIG. 1). As described above, the first cleaning device 31, the transfer unit 32, the peeling device 30, and the second cleaning device 33 are arranged in the peeling process station 3 in order away from the interface station 5.

The inspection device 6 inspects whether a residual of the adhesive G exists on the wafer to be processed W which is peeled by the peeling device 30. The cleaning device 8 cleans the wafer to be processed W which has been determined to have the residual of the adhesive G thereon by the inspection device 6. The cleaning device 8 has a bonding surface cleaning section 8a for cleaning the bonding surface $W_J$ of the wafer to be processed W, a non-bonding surface cleaning section 8b for cleaning the non-bonding surface $W_N$ of the wafer to be processed W, and a inverting section 8c for inverting the wafer to be processed W upside down.

The interface station 5 is provided with a transfer mechanism 41 as another transfer mechanism, which is configured to move along a transfer path 40 extending along the Y-axis direction. The transfer mechanism 41, which is movable in a vertical direction and is also rotatable around the vertical axis (or in a θ direction), transfers the wafer to be processed W between the peeling process station 3, the post-treatment station 4, the inspection device 6, and the cleaning device 8. A gas flow which is oriented vertically downward and is referred to as a downflow, is generated inside the interface station 5. An internal atmosphere of the interface station 5 is exhausted through an exhaust port (not shown).

Further, the post-treatment station 4 performs a predetermined post-treatment on the wafer to be processed W which is peeled by the peeling process station 3. An example of the predetermined post-treatment may include mounting the wafer to be processed W, inspecting electric properties of the electronic circuits formed on the wafer to be processed W, dicing the wafer to be processed W on a chip-by-chip basis, or the like. Further, a gas flow oriented downward and referred to as a downflow, is generated inside the post-treatment station 4. An internal atmosphere of the post-treatment station 4 is exhausted through an exhaust port (not shown).

Figure 3:
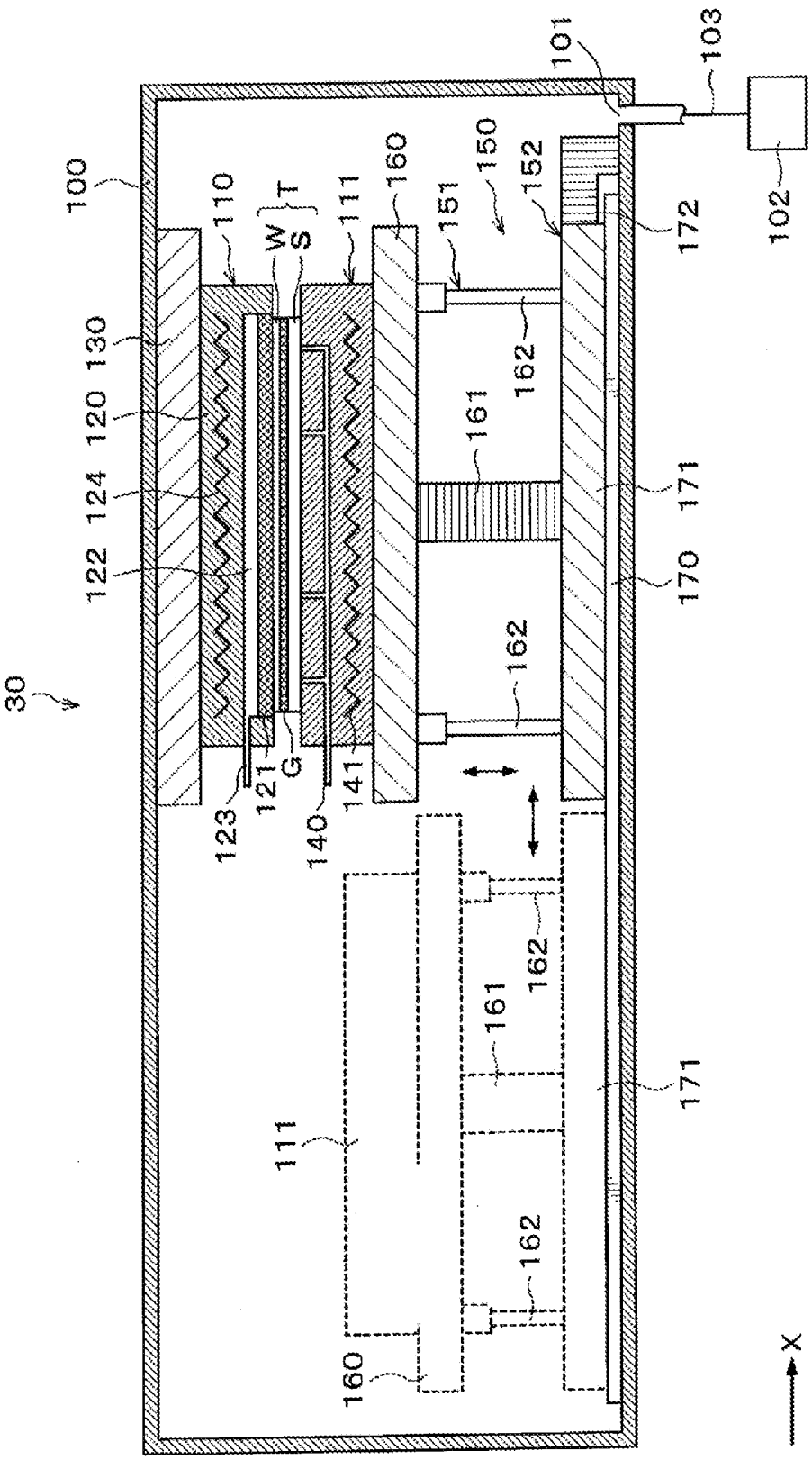
FIG. 3 is longitudinal cross sectional view schematically showing a configuration of a peeling device.

Next, a configuration of the aforementioned peeling device 30 will be described. As shown in FIG. 3, the peeling device 30 includes a housing 100 in which a plurality of equipments are accommodated. An inlet/outlet (not shown) through which the wafer to be processed W, the support wafer S, and the overlapped wafer T are passed is formed in a lateral side of the housing 100. An opening/closing shutter (not shown) is installed at the inlet/outlet. In addition, the housing 100 of this embodiment is made of, for example, a stainless steel thin plate or the like, not an internally-airtight one. The structure of the housing 100 is not limited to this embodiment. For example, the housing 100 may be an internally-sealable vessel.

An exhaust port 101 is formed at a bottom of the housing 100 so that the internal atmosphere of the housing 100 is exhausted through the exhaust port 101. An exhaust pipe 103, which is in communication with an exhaust device 102, such as a vacuum pump, is connected to the exhaust port 101. The internal atmosphere of the housing 100 is exhausted through the exhaust port 101, which causes a gas flow, which is oriented vertically downward and is referred to as a downflow, inside the housing 100.

The housing 100 is provided with a first holding unit 110 configured to adsorb the wafer to be processed W on the bottom surface thereof, and a second holding unit 111 configured to hold the support wafer S on the upper surface thereof. The first holding unit 110 is disposed above the second holding unit 111 while being positioned to face the second holding unit 111. That is, the peeling process is performed on the overlapped wafer T within the housing 100 with the wafer to be processed W disposed on the upper side and the support wafer S disposed on the lower side.

An example of the first holding unit 110 may include a porous chuck. The first holding unit 110 includes a flat plate main body 120. A porous body 121 is formed at a bottom side of the main body 120. The porous body 121 has approximately the same diameter as that of the wafer to be processed W and is in contact with the non-bonding surface $W_N$ of the wafer to be processed W. An example of the porous body 121 may include a silicon carbide.

Further, a suction space 122 is formed inside the main body 120 and above the porous body 121. The suction space 122 is formed to cover, e.g., the porous body 121. The suction space 122A is connected to a suction pipe 123. The suction pipe 123 is connected to a negative pressure generator (not shown), e.g., a vacuum pump. The non-bonding surface $W_N$ of the wafer to be processed is sucked by the suction pipe 123 through the suction space 122 and the porous body 121 so that the wafer to be processed W is adsorbed by the first holding unit 110.

In addition, a heating mechanism 124 configured to heat the wafer to be processed W is installed inside the main body 120 and above the suction space 122. A heater, for example, may be used as the heating mechanism 124.

A support plate 130 configured to support the first holding unit 110 is installed on the upper surface of the first holding unit 110. The support plate 130 is supported on a ceiling surface of the housing 100. Alternatively, the support plate 130 of this embodiment may be omitted, and the first holding unit 110 may be supported by being in contact with the ceiling surface of the housing 100.

A suction pipe 140 configured to adsorb the support wafer S is installed inside the second holding unit 111. The suction pipe 140 is connected to a negative pressure generator (not shown), e.g., a vacuum pump.

Further, a heating mechanism 141 configured to heat the support wafer S is installed inside the second holding unit 111. A heater, for example, may be used as the heating mechanism 141.

A moving mechanism 150 configured to vertically and horizontally move the second holding unit 111 and the support wafer S is provided below the second holding unit 111. The moving mechanism 150 includes a vertical moving unit 151 configured to vertically move the second holding unit 111, and a horizontal moving unit 152 configured to horizontally move the second holding unit 111.

The vertical moving unit 151 includes a support plate 160 for supporting the bottom surface of the second holding unit 111, a drive unit 161 for elevating up and down the support plate 160, and supporting members 162 for supporting the support plate 160. The drive unit 161 is equipped with, e.g., a ball screw (not shown) and a motor (not shown) to rotate the ball screw. The supporting members 162 are vertically expansible/contractible and are disposed at, e.g., three places between the support plate 160 and a supporting body 171, which will be described later.

The horizontal moving unit 152 includes a rail 170 extending in the X-axis direction (the left and right direction in FIG. 3), the supporting body 171 mounted to the rail 170, and a drive unit 172 for moving the supporting body 171 along the rail 170. The drive unit 172 is equipped with, e.g., a ball screw (not shown) and a motor (not shown) to rotate the ball screw.

In addition, elevating pins (not shown) which elevate the overlapped wafer T or the support wafer S supported from the bottom are disposed below the second holding unit 111. The elevating pins are inserted through through-holes (not shown) formed in the second holding unit 111 in such a manner that they project from the upper surface of the second holding unit 111.

Figure 4:
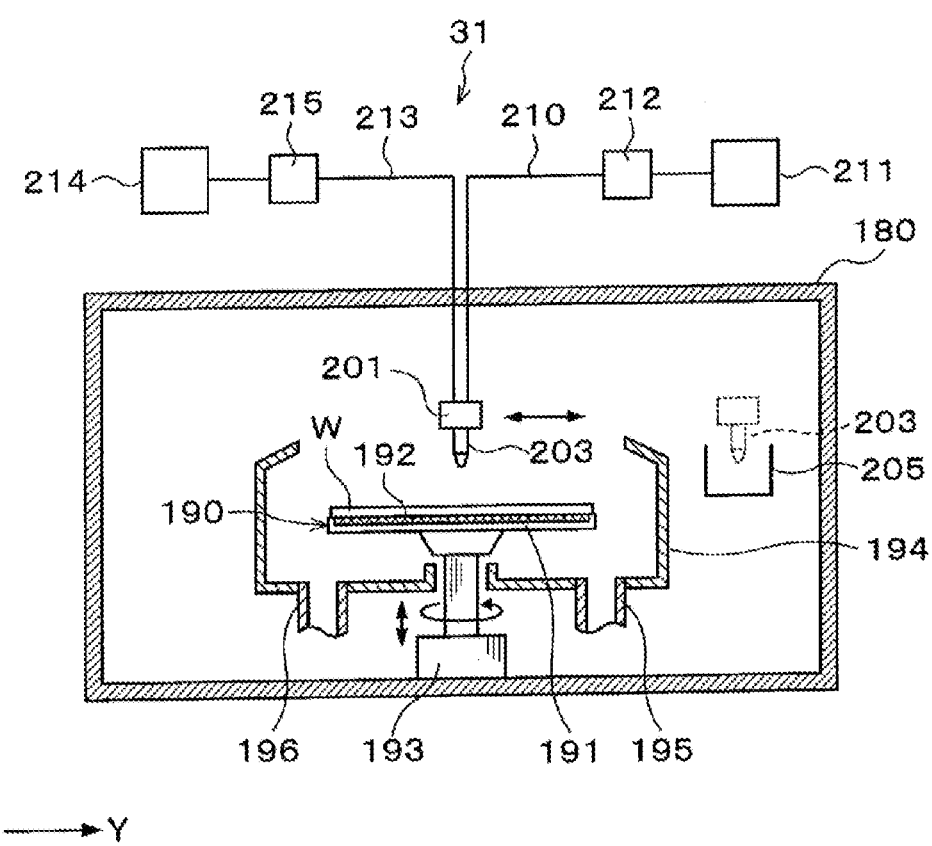
FIG. 4 is a longitudinal cross sectional view schematically showing a configuration of a first cleaning device.

Next, a configuration of the aforementioned first cleaning device 31 will be described. As shown in FIG. 4, the first cleaning device 31 includes a housing 180. An inlet/outlet (not shown), through which the wafer to be processed W is passed, is formed in a lateral side of the housing 180, and an opening/closing shutter (not shown) is installed in the inlet/outlet.

A porous chuck 190 configured to hold and rotate the wafer to be processed W is installed in the central portion of the housing 180. The porous chuck 190 includes a flat plate main body 191, and a porous body 192 formed on an upper surface of the main body 191. The porous body 192 has approximately the same diameter as that of the wafer to be processed W and is in contact with the non-bonding surface $W_N$ of the wafer to be processed W. For example, a silicon carbide may be used as the porous body 192. A suction pipe (not shown) is connected to the porous body 192. The non-bonding surface $W_N$ of the wafer to be processed W is sucked by the suction pipe through the porous body 192 so that the wafer to be processed W is adsorbed on the porous chuck 190.

A chuck drive unit 193, which is equipped with, e.g., a motor, is provided below the porous chuck 190. The porous chuck 190 can be rotated at a predetermined speed by the chuck drive unit 193. Further, the chuck drive unit 193 includes an up-down drive source such as a cylinder, and can move the porous chuck 190 up and down.

A cup 194 is provided around the porous chuck 190 to receive and collect liquid dropped or scattered from the wafer to be processed W. A discharge pipe 195 for draining the collected liquid and an exhaust pipe 196 for applying vacuum into the cup 194 and discharging an atmosphere therewithin are connected to the bottom surface of the cup 194. In addition, a gas flow which is oriented vertically downward and is referred to as a downflow, is generated inside the housing 180 of the first cleaning device 31. Further, the exhaust pipe 196 exhausts the internal atmosphere of the housing 180.

Figure 5:
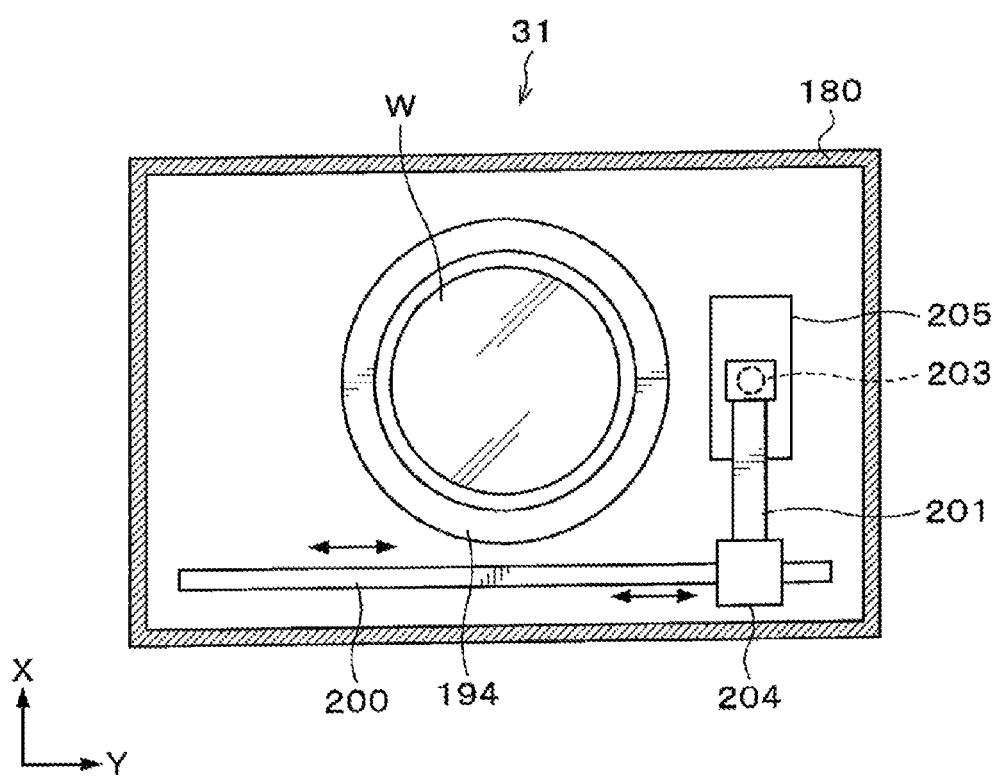
FIG. 5 is a transversal cross sectional view schematically showing a configuration of the first cleaning device.

As shown in FIG. 5, a rail 200 extending in the Y-axis direction (the left and right direction in FIG. 5) is formed at the back of the cup 194 in the X-axis direction (at the lower side in FIG. 5) of the cup 194. The rail 200 extends from the outer backside (the left side in FIG. 5) to the outer front (the right side in FIG. 5) of the cup 194 in the Y-axis direction, for example. An arm 201 is mounted in the rail 200.

As shown in FIGS. 4 and 5, a cleaning solution nozzle 203 is supported by the arm 201 to supply a cleaning solution such as an organic solvent to the wafer to be processed W. As shown in FIG. 5, the arm 201 is movable along the rail 200 by a nozzle drive unit 204. With this configuration, the cleaning solution nozzle 203 can move from a standby section 205 provided at the outer front side of the cup 194 in the Y-axis direction to outer backside of the wafer to be processed W positioned within the cup 194, and also can move along the diameter direction of the wafer to be processed W. The arm 201 is freely moved up and down by the operation of the nozzle drive unit 204 to adjust the height of the cleaning solution nozzle 203.

For example, a two-fluid nozzle is used as the cleaning solution nozzle 203. As shown in FIG. 4, the cleaning solution nozzle 203 is connected to a supply pipe 210 through which the cleaning solution is supplied to the cleaning solution nozzle 203. The supply pipe 210 is in communication with a cleaning solution supply source 211 to store the cleaning solution therein. A supply kit 212 including a valve, a flow rate regulator or the like, which controls a flow of the cleaning solution, is installed in the supply pipe 210. The cleaning solution nozzle 203 is connected to a supply pipe 213 through which an inert gas such as a nitrogen gas is supplied to the cleaning solution nozzle 203. The supply pipe 213 is in communication with a gas supply source 214 to store the inert gas therein. A supply kit 215 including a valve, a flow rate regulator or the like, which controls a flow of the inert gas, is installed in the supply pipe 213. The cleaning solution and the inert gas are mixed inside the cleaning solution nozzle 203 so that the mixture is supplied to the wafer to be processed W. Hereinafter, in some cases, the mixture of the cleaning solution and the inert gas is simply referred to as a "cleaning solution."

Elevating pins (not shown) which elevate the wafer to be processed W supported from the bottom may be installed below the porous chuck 190. In such a case, the elevating pins are inserted through through-holes (not shown) formed in the porous chuck 190 in such a manner that they project from the upper surface of the porous chuck 190. Further, the wafer to be processed W may be separated from the porous chuck 190 by elevating the elevating pins upward instead of elevating the porous chuck 190. Since configurations of the bonding surface cleaning section 8a and the non-bonding surface cleaning section 8b of the aforementioned cleaning device 8 are similar to that of the first cleaning device 31, including generating a gas flow which is oriented vertically downward and is referred to as a downflow, and therefore a description thereof will be omitted to avoid duplication.

Figure 6:
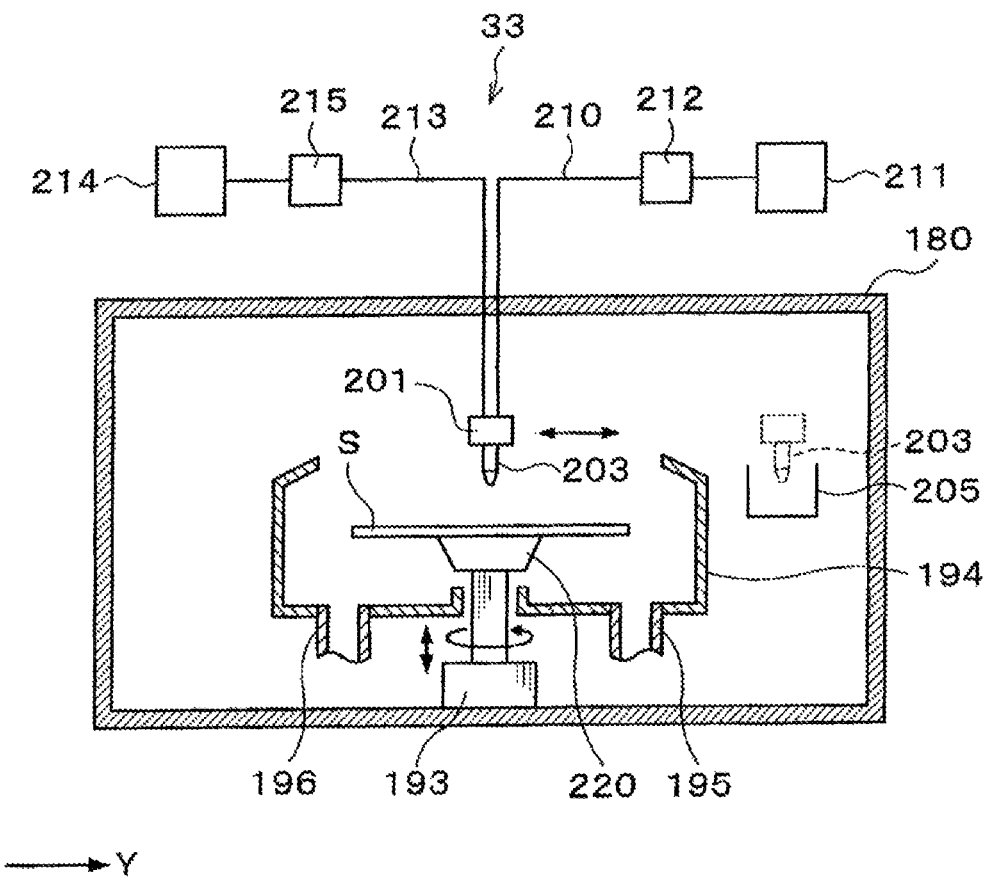
FIG. 6 is a longitudinal cross sectional view schematically showing a configuration of a second cleaning device.

The second cleaning device 33 has approximately the same configuration as that of the aforementioned first cleaning device 31. As shown in FIG. 6, in the second cleaning device 33, a spin chuck 220 is installed instead of the porous chuck 190 of the first cleaning device 31. The spin chuck 220 has a horizontal upper surface on which suction holes (not shown) for sucking, e.g., the support wafer S, is formed. By the suctioning force of the suction holes, the support wafer S can be adsorbed on the spin chuck 220. The other configurations of the second cleaning device 33 are similar to those of the first cleaning device 31, including generating a gas flow which is oriented vertically downward and is referred to as a downflow, and therefore a description thereof will be omitted to avoid duplication.

In the second cleaning device 33, a back rinse nozzle (not shown) which injects the cleaning solution toward the rear surface of the wafer to be processed W, i.e., the non-bonding surface $W_N$, may be installed below the spin chuck 220. The cleaning solution injected from the back rinse nozzle cleans the non-bonding surface $W_N$ of the wafer to be processed W and the peripheral portion thereof.

Figure 7:
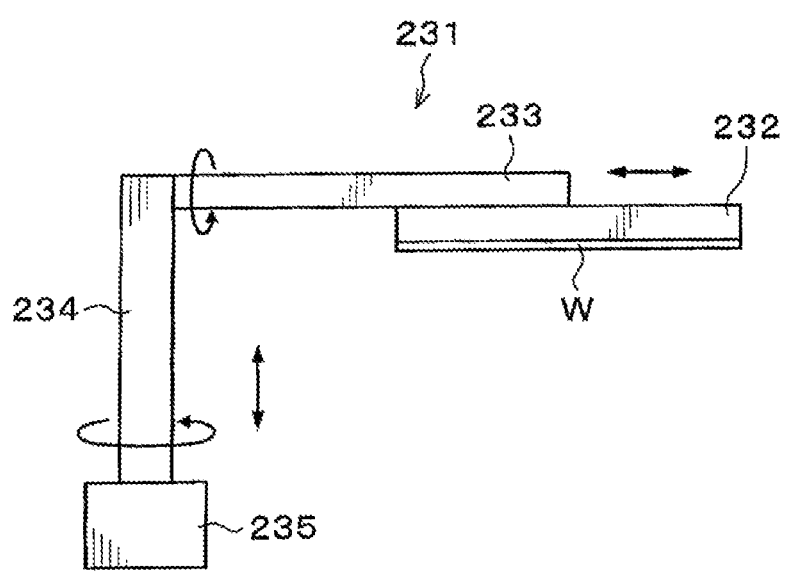
FIG. 7 is a lateral view schematically showing a configuration of a second transfer unit.

Next, a configuration of the aforementioned transfer unit 32 will be described. As shown in FIG. 1, the transfer unit 32 includes a transfer mechanism 231 which is installed in a wafer transfer region 230 that is bounded by the first cleaning device 31, the peeling device 30 and the wafer transfer region 9. As shown in FIG. 7, the transfer mechanism 231 includes a Bernoulli chuck 232 configured to hold the wafer to be processed W. The Bernoulli chuck 232 blasts air to float the wafer to be processed W so that the wafer to be processed W can be held in a contactless state. The Bernoulli chuck 232 is supported by a supporting arm 233. The supporting arm 233 is supported by a first drive unit 234. By the operation of the first drive unit 234, the supporting arm 233 is rotatable around a horizontal axis and also horizontally expansible/contractible. A second drive unit 235 is provided below the first drive unit 234. By the operation of the second drive unit 235, the first drive unit 234 is rotatable around a vertical axis and also vertically movable. Further, a gas flow which is oriented vertically downward and is referred to as a downflow, is generated inside the transfer unit 32, i.e., in the wafer transfer region 230. An internal atmosphere of the wafer transfer region 230 is exhausted through the exhaust port (not shown).

A configuration of the transfer mechanism 41 in FIG. 1 is similar to that of the aforementioned transfer mechanism 231 of the transfer unit 32 except that the second drive unit 235 of the transfer mechanism 41 is mounted on the transfer path 40 and the transfer mechanism 41 is configured to be movable along the transfer path 40. Therefore a description thereof will be omitted to avoid duplication.

As shown in FIG. 1, the aforementioned peeling system 1 includes a control unit 300. The control unit 300 is, for example, a computer, and includes a program storage (not shown). The program storage stores a program which controls processing of the wafer to be processed W, the support wafer S, and the overlapped wafer T in the peeling system 1. The program storage also stores a program which controls operation of a driving system including the aforementioned processing devices and the transfer unit to implement a peeling process in the peeling system 1, which will be described later. The programs may be installed in the control unit 300a from a computer readable storage medium H such as a hard disk (HD), a flexible disk (FD), a compact disk (CD), a magneto-optical disk (MO), a memory card or the like.

Figure 8:
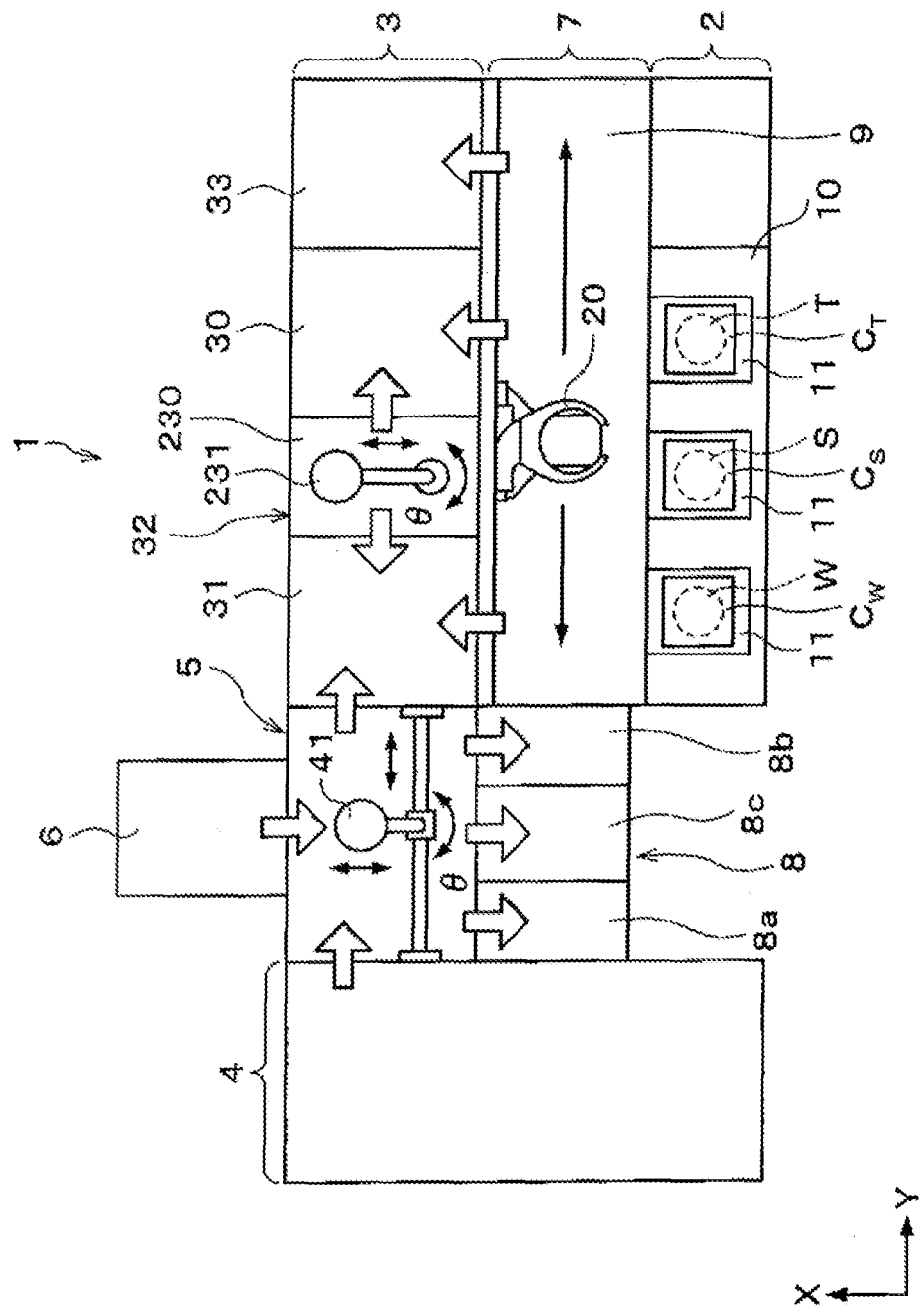
FIG. 8 is a view illustrating a gas flow generated in a peeling system.

Next, when a peeling process for the overlapped wafer T is performed in the peeling system 1 configured as above, a gas flow generated within the peeling system 1 will be described with reference to FIG. 8. In FIG. 8, each arrow indicates a direction of the gas flow.

Out of the post-treatment station 4, the interface station 5, and the peeling process station 3 in the peeling system 1, a pressure within the post-treatment station 4 is highest and a pressure within the peeling process station 3 is lowest. Thus, the pressure within the post-treatment station 4 is higher than the pressure within the interface station 5, which causes a gas flow from the post-treatment station 4 to the interface station 5. In addition, the pressure within the interface station 5 is higher than the pressure within the peeling process station 3, which causes a gas flow from the interface station 5 to the peeling process station 3.

Meanwhile, the pressure within the interface station 5 is lower than a pressure within the inspection device 6 but is higher than those within the bonding surface cleaning section 8a, the non-bonding surface cleaning section 8b and the inverting section 8c of the cleaning device 8. This causes a gas flow from the inspection device 6 to the interface station 5 and a gas flow from the interface station 5 to the bonding surface cleaning section 8a, the non-bonding surface cleaning section 8b, and the inverting section 8c of the cleaning device 8, respectively.

In addition, a pressure within the transfer station 7 is higher than a pressure within the peeling device 30, a pressure within the first cleaning device 31, and a pressure within the second cleaning device 33 of the peeling process station 3. This causes gas flows from the transfer station 7 to the peeling device 30, the first cleaning device 31, and the second cleaning device 33, respectively.

Figure 9:
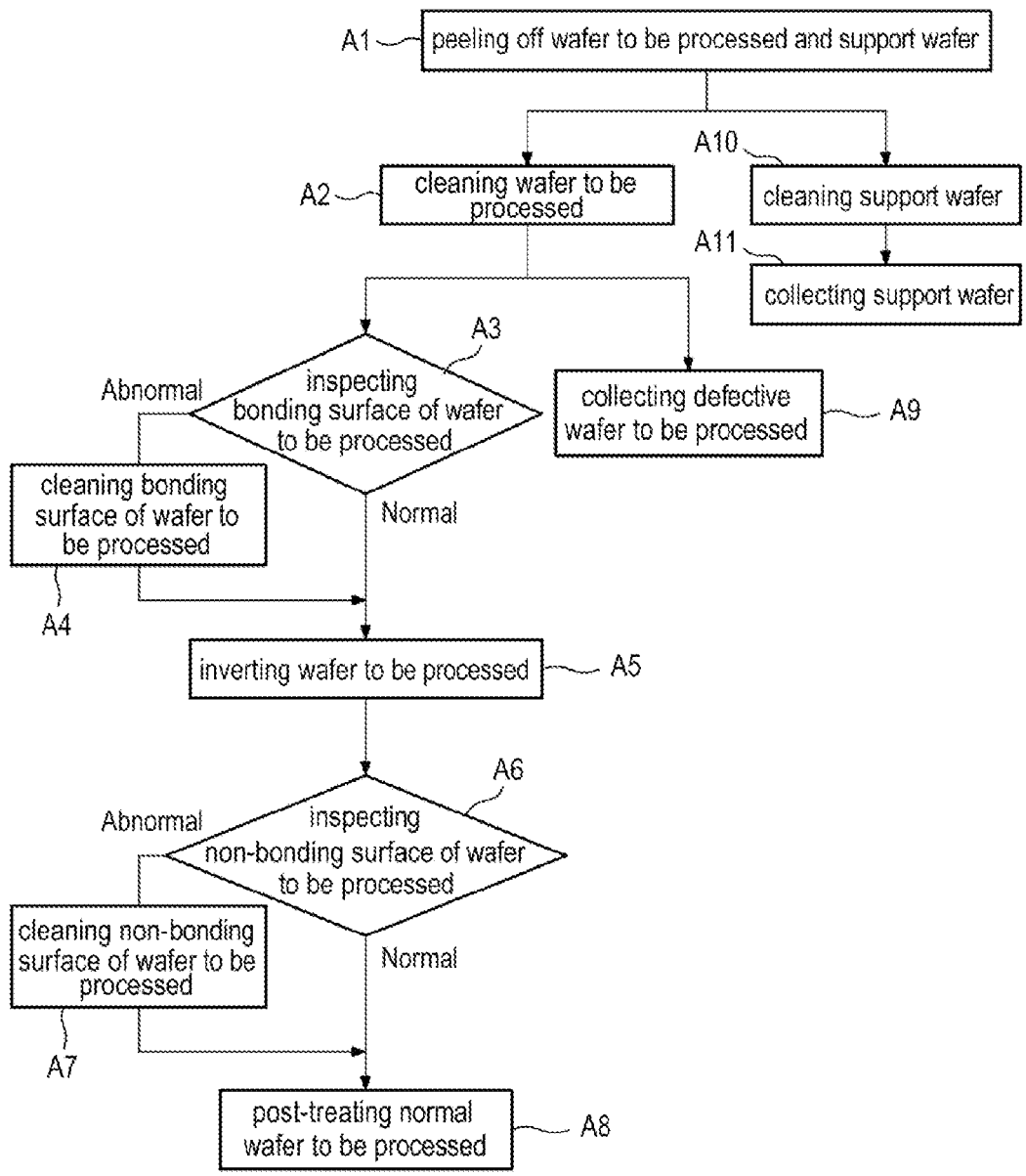
FIG. 9 is a flowchart illustrating main operations of a peeling process.

In addition, a pressure within the transfer unit 32 is higher than the pressure within the peeling device 30 and the pressure within the first cleaning device 31. This causes gas flows from the transfer unit 32 to the peeling device 30 and the first cleaning device 31, respectively Next, a peeling process of the wafer to be processed W and the support wafer S, to be performed using the peeling system 1 configured as above, will be described. FIG. 9 is a flowchart illustrating main operations of the peeling process.

First, a cassette $C_T$ with a plurality of overlapped wafers T accommodated therein, an empty cassette $C_W$, and an empty cassette $C_S$ are loaded on a respective cassette loading plate 11 of the carry-in/carry-out station 2. Thereafter, each of the overlapped wafers T within the cassette $C_T$ is taken out by the transfer mechanism 20 and then is transferred to the peeling device 30 of the peeling process station 3. At this time, the overlapped wafer T is transferred while the wafer to be processed W is positioned at the upper side and the support wafer S is positioned at the lower side.

Figure 10:
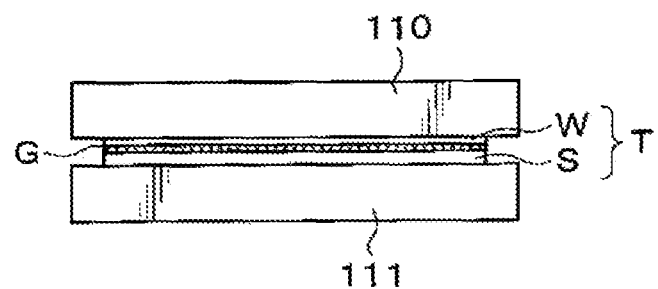
FIG. 10 is a view showing a state where an overlapped wafer is held by a first holding unit and a second holding unit.

The overlapped wafer T loaded into the peeling device 30 is adsorbed to the second holding unit 111. Thereafter, the second holding unit 111 is elevated by the moving mechanism 150 so that, as shown in FIG. 10, the overlapped wafer T is held by the first holding unit 110 and the second holding unit 111 with the overlapped wafer T interposed therebetween. At this time, the non-bonding surface $W_N$ of the wafer to be processed W is adsorbed to the first holding unit 110, and the non-bonding surface $S_N$ of the support wafer S is adsorbed to the second holding unit 111.

Thereafter, the overlapped wafer T is heated to a predetermined temperature, e.g., 200 degrees C., by the heating mechanisms 124 and 141. Thus, the adhesive G in the overlapped wafer T is softened.

Figure 11:
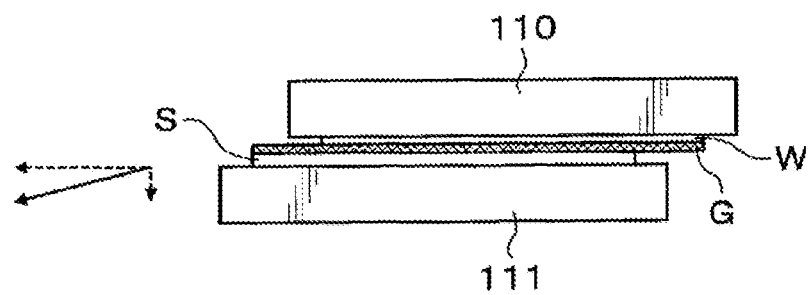
FIG. 11 is a view showing a state where the second holding unit is moved in vertical and horizontal directions.
Figure 12:
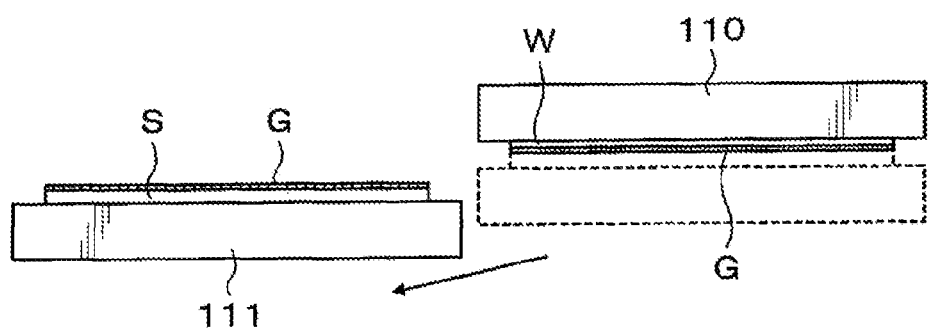
FIG. 12 is a view showing a state where the wafer to be processed and the support wafer are peeled off from each other.

Subsequently, while the heating mechanisms 124 and 141 heat the overlapped wafer T to maintain the soft state of the adhesive G, the moving mechanism 150 moves the second holding unit 111 and the support wafer S in vertical and horizontal directions, i.e., obliquely downward, as shown in FIG. 11. Then, as shown in FIG. 12, the wafer to be processed W held by the first holding unit 110 and the support wafer S held by the second holding unit 111 are peeled off from each other (Operation A1 in FIG. 9).

At this time, the second holding unit 111 is moved by a distance of 100 µm in the vertical direction and by a distance of 300 mm in the horizontal direction. In this embodiment, a thickness of the adhesive G in the overlapped wafer T is in the range of, e.g., 30 µm to 40 µm, and a height of an electronic circuit (bump) formed on the bonding surface $W_J$ of the wafer to be processed W is, e.g., 20 µm. Accordingly, a distance between the electronic circuit formed on the wafer to be processed W and the support wafer S becomes very small. As such, for example, when the second holding unit 111 is moved only in the horizontal direction, the electronic circuit is brought into contact with the support wafer S, which may cause damages to the electronic circuit. In this embodiment the electronic circuit is not brought into contact with the support wafer S because the second holding unit 111 is moved simultaneously in both the horizontal and vertical directions, thus preventing the electronic circuit from being damaged. A ratio of a vertical movement distance to a horizontal movement distance of the second holding unit 111 may be set based on the height of the electronic circuit (bump) formed on the wafer to be processed W.

Thereafter, the wafer to be processed W peeled by the peeling device 30 is transferred to the first cleaning device 31 by the transfer mechanism 231. Hereinafter, the transfer of the wafer to be processed W by the transfer mechanism 231 will be described.

Figure 13:
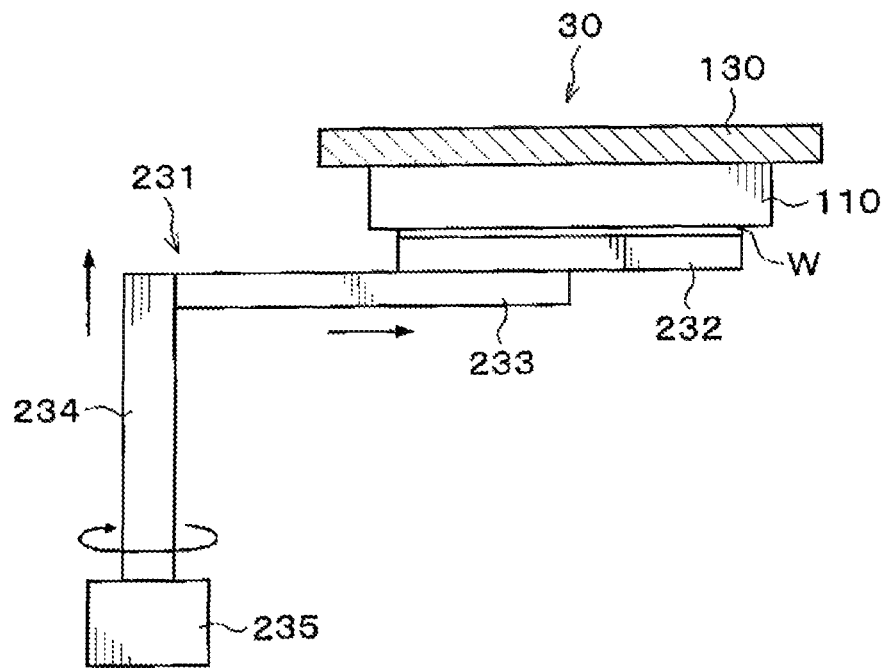
FIG. 13 is a view showing a state where the wafer to be processed is transferred from the first holding unit to a Bernoulli chuck.

As shown in FIG. 13, the supporting arm 233 is extended such that the Bernoulli chuck 232 is positioned below the wafer to be processed W which is held by the first holding unit 110. Thereafter, the Bernoulli chuck 232 is lifted up to release the suction of the wafer to be processed W by the suction pipe 123 in the first holding unit 110. Then, the wafer to be processed W is transferred from the first holding unit 110 to the Bernoulli chuck 232. At this time, although the bonding surface $W_J$ of the wafer to be processed W is held by the Bernoulli chuck 232, since the Bernoulli chuck 232 holds the wafer to be processed W in a contactless manner, the electronic circuit formed on the bonding surface $W_J$ of the wafer to be processed W are not damaged.

Figure 14:
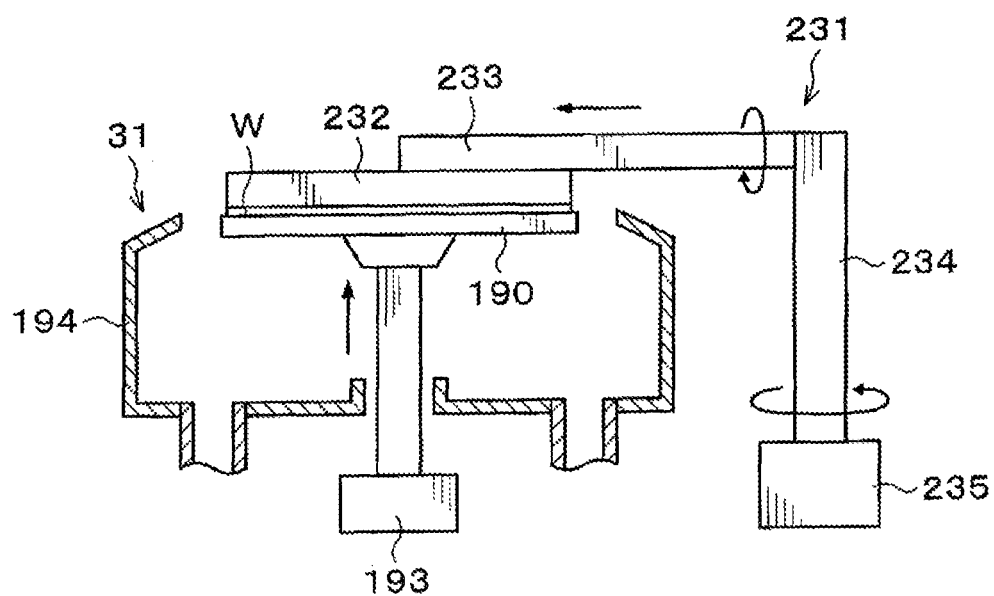
FIG. 14 is a view showing a state where the wafer to be processed is transferred from the Bernoulli chuck to a porous chuck.

Next, as shown in FIG. 14, the supporting arm 233 rotates such that the Bernoulli chuck 232 is lifted above the porous chuck 190 of the first cleaning device 31. Simultaneously, the Bernoulli chuck 232 is inverted such that the wafer to be processed W is oriented downward. At this time, the porous chuck 190 is elevated above the cup 194 and is on standby. Thereafter, the wafer to be processed W is transferred from the Bernoulli chuck 232 to the porous chuck 190 and then is adsorbed to the porous chuck 190.

As described above, when the wafer to be processed W is adsorbed to the porous chuck 190, the porous chuck 190 is lowered to a predetermined position. Subsequently, the cleaning solution nozzle 203 positioned within the standby section 205 is moved, by the arm 201, above the central portion of the wafer to be processed W (see in FIG. 5). Thereafter, the cleaning solution is supplied from the cleaning solution nozzle 203 onto the bonding surface $W_J$ of the wafer to be processed W while rotating the wafer to be processed W by the porous chuck 190. The supplied cleaning solution is spread to the entire surface of the bonding surface $W_J$ of the wafer to be processed W due to a centrifugal force of the rotation, and the bonding surface $W_J$ of the wafer to be processed W is cleaned (Operation A2 in FIG. 9).

As described above, the plurality of the overlapped wafers T loaded into the carry-in/carry-out station 2 are inspected in advance to distinguish between a normal overlapped wafer T including a normal wafer to be processed W and an abnormal overlapped wafer T including an abnormal wafer to be processed W.

The bonding surface $W_J$ of the normal wafer to be processed W peeled off from the normal overlapped wafer T is cleaned in Operation A2 and then transferred to the inspection device 6 by the transfer mechanism 41. The transfer of the wafer to be processed W by the transfer mechanism 41 is substantially similar to that of the wafer to be processed W by the aforementioned transfer mechanism 231. Thus a description thereof will be omitted to avoid duplication.

The inspection device 6 inspects whether the residual of the adhesive G exists on the bonding surface $W_J$ of the wafer to be processed W (Operation A3 in FIG. 9). If the inspection device 6 determines that the residual of the adhesive G exists, the transfer mechanism 41 transfers the wafer to be processed W to the bonding surface cleaning section 8*a* of the cleaning device 8 where the bonding surface $W_J$ is cleaned (Operation A4 in FIG. 9). After the bonding surface $W_J$ is cleaned, the transfer mechanism 41 transfers the wafer to be processed W to the inverting section 8*c* where the wafer to be processed W is inverted upside down. Meanwhile, if no residual of the adhesive G is determined to exist, the inverting section 8*c* inverts the wafer to be processed W without being transferred to the bonding surface cleaning section 8*a* (Operation A5 in FIG. 9).

Thereafter, the transfer mechanism 41 transfers the inverted wafer to be processed W to the inspection device 6 where the inspection is performed on the non-bonding surface $W_N$ (Operation A6 in FIG. 9). If the residual of the adhesive G is determined to exist in the non-bonding surface $W_N$, the wafer to be processed W is transferred to the non-bonding surface cleaning section 8*b* by the transfer mechanism 41 where the non-bonding surface $W_N$ is cleaned (Operation A7 in FIG. 9). Subsequently, the cleaned wafer to be processed W is transferred to the post-treatment station 4 by the transfer mechanism 41. Meanwhile, if no residual of the adhesive G is determined to exist by the inspection device 6, the wafer to be processed W is transferred to the post-treatment station 4 as it is without being transferred to the non-bonding surface cleaning section 8*b*.

Thereafter, the wafer to be processed W is subjected to a predetermined post-treatment in the post-treatment station 4 (Operation A8 in FIG. 9). In this manner, the wafer to be processed W is used as a product.

On the other hand, the bonding surface $W_J$ of the abnormal wafer to be processed W peeled off from the abnormal (or defective) overlapped wafer T is cleaned in Operation A2 and then transferred to the carry-in/carry-out station 2 by the transfer mechanism 20. Thereafter, the abnormal wafer to be processed W is discharged from the carry-in/carry-out station 2 to the outside for the collection (Operation A9 in FIG. 9).

While the aforementioned operations A1 to A9 are performed on the wafer to be processed W, the support wafer S peeled off from the peeling device 30 is transferred to the second cleaning device 33 by the transfer mechanism 20. In the second cleaning device 33, the bonding surface $S_J$ of the support wafer S is cleaned (Operation A10 in FIG. 9). The cleaning of the support wafer S in the second cleaning device 33 is similar to that of the wafer to be processed W in the aforementioned first cleaning device 31 and, therefore a description thereof will be omitted to avoid duplication.

Thereafter, the support wafer S having the cleaned bonding surface $S_J$ is transferred to the carry-in/carry-out station 2 by the transfer mechanism 20. The support wafer S is then discharged from the carry-in/carry-out station 2 to the outside for the collection (Operation A11 in FIG. 9). In this manner, a series of the peeling processes for the wafer to be processed W and the support wafer S is terminated.

According to the above embodiments, the pressure within the transfer station 7 is higher than the pressure within the peeling device 30, which causes the gas flow from the transfer station 7 to the peeling device 30. In other words, the internal atmosphere of the peeling device 30 is not discharged to the transfer station 7 side (see in FIG. 8). In addition, the pressure within the transfer unit 32 is higher than the pressure within the peeling device 30, which causes the gas flow from the transfer unit 32 to the peeling device 30. As such, the internal atmosphere of the peeling device 30 is not discharged to the transfer unit 32 side. Thus, no particle is discharged from the peeling device 30 to the outside. This prevents the particles, which are generated when the wafer to be processed W and the support wafer S are peeled off, from being spread to the outside the peeling device 30.

In addition, the pressure within the interface station 5 is higher than the pressure within the peeling process station 3 and is lower than the pressure within the post-treatment station 4, which causes the gas flow which is oriented from the post-treatment station 4 to the peeling process station 3. Thus, even when the particles are spread into the peeling process station 3, it is possible to prevent the particles from flowing into the interface station 5 and the post-treatment station 4 from the peeling process station 3. This allows the interior of the post-treatment station 4 configured to perform the post-treatment to be maintained at a clean state, Thus, it is possible to prevent deterioration in a production yield which may be caused by the particles being attached onto the wafer to be processed W in the post-treatment station 4.

In addition, the pressure within the transfer station 7 is higher than the pressure within the first cleaning device 31 and the pressure within the second cleaning device 33, which causes the gas flows from the transfer station 7 to the first cleaning device 31 and the second cleaning device 33, respectively. This prevents the particles generated with the cleaning operations of the respective cleaning devices 31 and 33 from flowing into the transfer station 7. Accordingly, it is possible to prevent the particles from being attached onto the overlapped wafer T, the wafer to be processed W, and the support wafer S during the transfer.

Further, the pressure within the inspection device 6 is higher than the pressure within the interface station 5, which causes the gas flow from the inspection device 6 to the interface station 5. As such, even when particles are spread to the interface station 5, it is possible to prevent the particles from flowing into the inspection device 6. This allows the interior of the inspection device 6 to be maintained at a clean state, which makes it possible to prevent, e.g., the normal wafer to be processed W from being contaminated by the particles in the inspection device 6.

Further, the pressure within the interface station 5 is higher than the pressure within the cleaning device 8, which causes the gas flows from the interface station 5 to the cleaning device 8. This prevents the particles from being attached onto the wafer to be processed W in the course of transferring the wafer to be processed W in the interface station 5.

Further, the internal atmospheres of the first cleaning device 31, the second cleaning device 33, the peeling device 30, and the cleaning device 8 are exhausted to the outside so that an internal atmosphere of the peeling system 1 is exhausted to the outside. This prevents the particles from existing in the internal atmosphere of the peeling system 1.

According to the above embodiments, after the wafer to be processed W and the support wafer S are peeled off from the overlapped wafer T in the peeling device 30, the peeled-off wafer to be processed W can be cleaned by the first cleaning device 31 and the peeled-off support wafer S can be cleaned by the second cleaning device 33. As described above, according to the above embodiments, a series of processes including peeling the wafer to be processed W and the support wafer S and cleaning the wafer to be processed W and the support wafer S can be effectively performed in the single peeling system 1. In addition, the cleaning of the wafer to be processed W and the cleaning of the support wafer S are simultaneously performed in the first cleaning device 31 and the second cleaning device 33, respectively. Furthermore, while the wafer to be processed W and the support wafer S are peeled off from each other in the peeling device 30, another wafer to be processed W and another support wafer S may also be processed in the first cleaning device 31 and the second cleaning device 33, respectively. Therefore, it is possible to efficiently perform the peeling of the wafer to be processed W and the support wafer S, which improves a throughput of the peeling process.

In addition, when the wafer to be processed W peeled by the peeling process station 3 is the normal wafer to be processed W, it is subjected to the predetermined post-treatment in the post-treatment station 4 to use the same as a product. On the other hand, when the wafer to be processed W peeled by the peeling process station 3 is the abnormal wafer to be processed W, it is collected by the carry-in/carry-out station 2. Accordingly, since only the normal wafer to be processed W is used as the product, it is possible to improve the production yield. Further, the abnormal wafer to be processed W is collected. The collected wafer to be processed W may be reused depending on an abnormal degree leading to an effective use of resources and reduction in manufacturing costs.

The series of processes as described above, including the peeling of the wafer to be processed W and the support wafer S and the post-treatment of the wafer to be processed W, are performed thus further improving the production yield of process for the wafer.

In addition, the support wafer S peeled by the peeling device 30 is cleaned and then is collected by the carry-in/carry-out station 2 so that the support wafer S can be reused. This makes an effective use of resources and reduces manufacturing costs.

Furthermore, the peeling device 30 moves the second holding unit 111 and the support wafer S in the vertical and horizontal directions using the moving mechanism 150 while heating the overlapped wafer T such that the wafer to be processed W and the support wafer S are peeled off from each other (see in FIG. 5). The movement of the second holding unit 111 in both the vertical and horizontal directions prevents the electronic circuit formed on the wafer to be processed W from being brought into contact with the support wafer S even when a distance therebetween is very small. Thus, it is possible to avoid the contact between the wafer to be processed W and the support wafer S. This prevents the electronic circuit from being damaged and facilitates the peeling process of the wafer to be processed W and the support wafer S.

In addition, since each of the transfer mechanism 231 and the transfer mechanism 41 is equipped with the Bernoulli chuck 232 configured to hold the wafer to be processed W, it is possible to stably hold the wafer to be processed W even for a thin one. Further, in the transfer mechanism 231, since the Bernoulli chuck 232 holds the bonding surface $W_J$ of the wafer to be processed W in a contactless manner, it is possible to prevent the electronic circuit formed on the bonding surface $W_J$ of the wafer to be processed W from being damaged.

Since the first cleaning device 31 includes the porous chuck 190 configured to hold the wafer to be processed W, it is possible to stably hold the wafer to be processed W even for a thin one.

In the above embodiments, since the inspection device 6 is configured to inspect the wafer to be processed W, it is possible to correct process conditions to be applied in the peeling system 1 based on results of the inspection. This makes it possible to further stably peel off the wafer to be processed W and the support wafer S.

While in the above embodiments, the second holding unit 111 has been described as being moved in the vertical and horizontal directions in the peeling device 30, the first holding unit 110, instead of the second holding unit 111, may be moved in the vertical and horizontal directions. Alternatively, both the first holding unit 110 and the second holding unit 111 may be moved in the vertical and horizontal directions.

While the second holding unit 111 has been described as being moved in the both vertical and horizontal directions in the peeling device 30, the second holding unit 111 may be moved only in the horizontal direction and a moving speed thereof may be varied. As an example, an initial moving speed of the second holding unit 111 may be set to a lower level and be gradually increased. That is, when the second holding unit 111 starts to move, since a bonding area between the wafer to be processed W and the support wafer S is large so that the electronic circuit formed on the wafer to be processed W can be easily influenced by the adhesive G, the initial moving speed of the second holding unit 111 is set to a lower level. As the bonding area between the wafer to be processed W and the support wafer S becomes small, the influence of the adhesive G on the electronic circuit formed on the wafer to be processed W becomes smaller, the moving speed of the second holding unit 111 is gradually increased. This avoids the contact between the electronic circuit and the support wafer S and prevents the electronic circuit from being damaged.

While in the above embodiments, the second holding unit 111 has been described to be moved in the vertical and horizontal directions in the peeling device 30, when a distance between the electronic circuit formed on the wafer to be processed W and the support wafer S is sufficiently large, the second holding unit 111 may be moved only in the horizontal direction. This configuration prevents the electronic circuit from being brought into contact with the support wafer S and also simplifies controlling the movement of the second holding unit 111. In some embodiments, the second holding unit 111 may be moved only in the vertical direction to peel off the wafer to be processed W and the support wafer S from each other. Alternatively, an end of a peripheral portion of the second holding unit 111 may be moved only in the vertical direction to peel off the wafer to be processed W and the support wafer S from each other.

While in the above embodiments, the wafer to be processed W and the support wafer S have been described to be peeled off while positioning the wafer to be processed W at the upper side and the support wafer S at the lower side, the positions of the wafer to be processed W and the support wafer S may be inverted.

In the transfer mechanism 231 according to the above embodiments, a plurality of supply holes (not shown) through which the cleaning solution is supplied may be formed on a surface of the Bernoulli chuck 232. With this configuration, when the wafer to be processed W is transferred from the Bernoulli chuck 232 to the porous chuck 190 of the first cleaning device 31, the cleaning solution is supplied from the Bernoulli chuck 232 onto the bonding surface $W_J$ of the wafer to be processed W, thus cleaning the bonding surface $W_J$ and also the Bernoulli chuck 232 itself. This reduces the amount of time required to clean the wafer to be processed W in the first cleaning device 31 later, which improves a production yield in the peeling process. Furthermore, since the Bernoulli chuck 232 can be cleaned, it is possible to transfer a subsequent wafer to be processed W in a reliable manner.

While in the above embodiments, the transfer mechanism 41 has been described to include the Bernoulli chuck 232, it may include a porous chuck (not shown) instead of the Bernoulli chuck 232. Even in such a case, it is possible to stably absorb a thin wafer to be processed W using the porous chuck.

In the above embodiments, the two-fluid nozzle has been described to be used as the cleaning solution nozzle 203 of the first cleaning device 31 and the second cleaning device 33, but is not limited thereto, various types of nozzles may be used. As an example, a nozzle body in which a nozzle configured to supply a cleaning solution and a nozzle configured to supply an inert gas are combined, a spray nozzle, a jet nozzle, a megasonic nozzle, or the like may be used as the cleaning solution nozzle 203. In addition, in order to improve a production yield in the cleaning process, a cleaning solution heated to, e.g., 80 degrees C., may be supplied.

In some embodiments, in addition to the cleaning solution nozzle 203, a nozzle configured to supply IPA (isopropyl alcohol) may be provided in the first cleaning device 31 and the second cleaning device 33. In such a case, after the wafer to be processed W or the support wafer S is cleaned by the cleaning solution supplied from the cleaning solution nozzle 203, the cleaning solution supplied onto the wafer to be processed W or the support wafer S is substituted with the IPA. This makes it possible to more reliably clean the bonding surface $W_J$ or $S_J$ of the wafer to be processed W or the support wafer S.

The peeling system 1 according to the above embodiments may include a temperature adjusting unit (not shown) which cools the wafer to be processed W heated in the peeling device 30 up to a predetermined temperature. This makes it possible to adjust the temperature of the wafer to be processed W to a suitable temperature, thus smoothly performing a subsequent process.

While in the above embodiments, the wafer to be processed W has been described to be subjected to the post-treatment in the post-treatment station 4 for the product, the present disclosure is not limited thereto. For example, the present disclosure may be applied when a wafer to be processed used in, e.g., three-dimensional integration technique, is peeled off from a support wafer. The three-dimensional integration technique is a technique to meet a recent demand for high density integration of semiconductor devices, in which a plurality of highly-integrated semiconductor devices are stacked in three dimensions, instead of placing the plurality of semiconductor devices on a horizontal plane. Even in this three-dimensional integration technique, there is a desire to stack thin the wafer to be processed. The thin wafer to be processed is bonded to a support wafer, and subsequently, a predetermined process is performed onto the bonded wafers.

Figure 15:
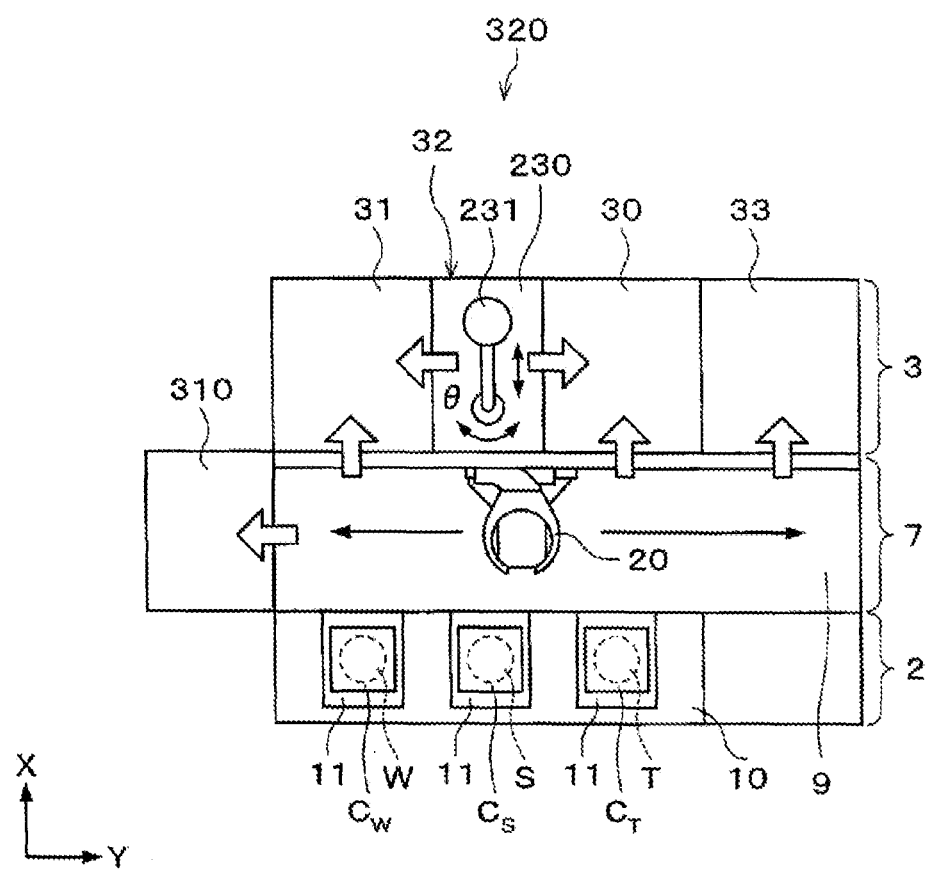
FIG. 15 is a plane view schematically showing the configuration of a peeling system according to another embodiment.

While in the above embodiments, the peeling process has been described to be performed onto the wafer to be processed W that is thinned by the polishing process, the present disclosure may be applied in peeling off the overlapped wafer T before the wafer to be processed W is thinned by the polishing process. The peeling process of the overlapped wafer T before the wafer to be processed W is thinned, may be performed when the overlapped wafer T is determined to have a defect before the thinning process is performed, for example. As an example, as shown in FIG. 15, the peeling process may be performed by a peeling system 320 including the carry-in/carry-out station 2, the peeling process station 3, the transfer station 7, and a post-treatment station 310. In the peeling system 320, since a wafer to be processed W is handled before the thinning process, the second cleaning device 33 shown in FIG. 15 may service as the first cleaning device 31.

The post-treatment station 310, which treats a peeled-off wafer to be processed W before being polished, i.e., an abnormal wafer to be processed W that is detected to have a defect in the inspection process, is provided adjacent to the transfer station 7. A gas flow, which is vertically downward and is referred to as a downflow, is generated inside the post-treatment station 310. An internal atmosphere of the post-treatment station 4 is exhausted through an exhaust port (not shown).

In the peeling system 320, a pressure within the post-treatment station 310 is set to be lower than a pressure within the transfer station 7. This causes a gas flow from the transfer station 7 to the post-treatment station 310. A relationship between the pressure within the transfer station 7 and the pressure within the peeling process station 3 is similar to that of the aforementioned peeling system 1, and thus a description thereof will be omitted to avoid duplication.

The wafer to be processed W peeled by the peeling device 30 is transferred to the post-treatment station 310 by the transfer mechanism 20 of the transfer station 7 where the peeled-off wafer to be processed W is subjected to a predetermined process.

According to the above embodiments, no particle is discharged from the peeling device 30 to the transfer station 7 side. Accordingly, it is possible to prevent the particles generated during the peeling process from being spread to the outside of the peeling device 30. In addition, since gas flows which are oriented from the transfer station 7 to the peeling process station 3 and the post-treatment station 310 are respectively generated, it is possible to prevent the particles from being attached to the overlapped wafer T, the wafer to be processed W, and the support wafer S during the transfer.

In FIGS. 8 and 15, in actual, openings (not shown) through which wafers pass are formed at portions of a sidewall at which white arrows are positioned. Through these openings, the gas flows in the directions of the white arrows as shown in FIGS. 8 and 15.

Figure 16:
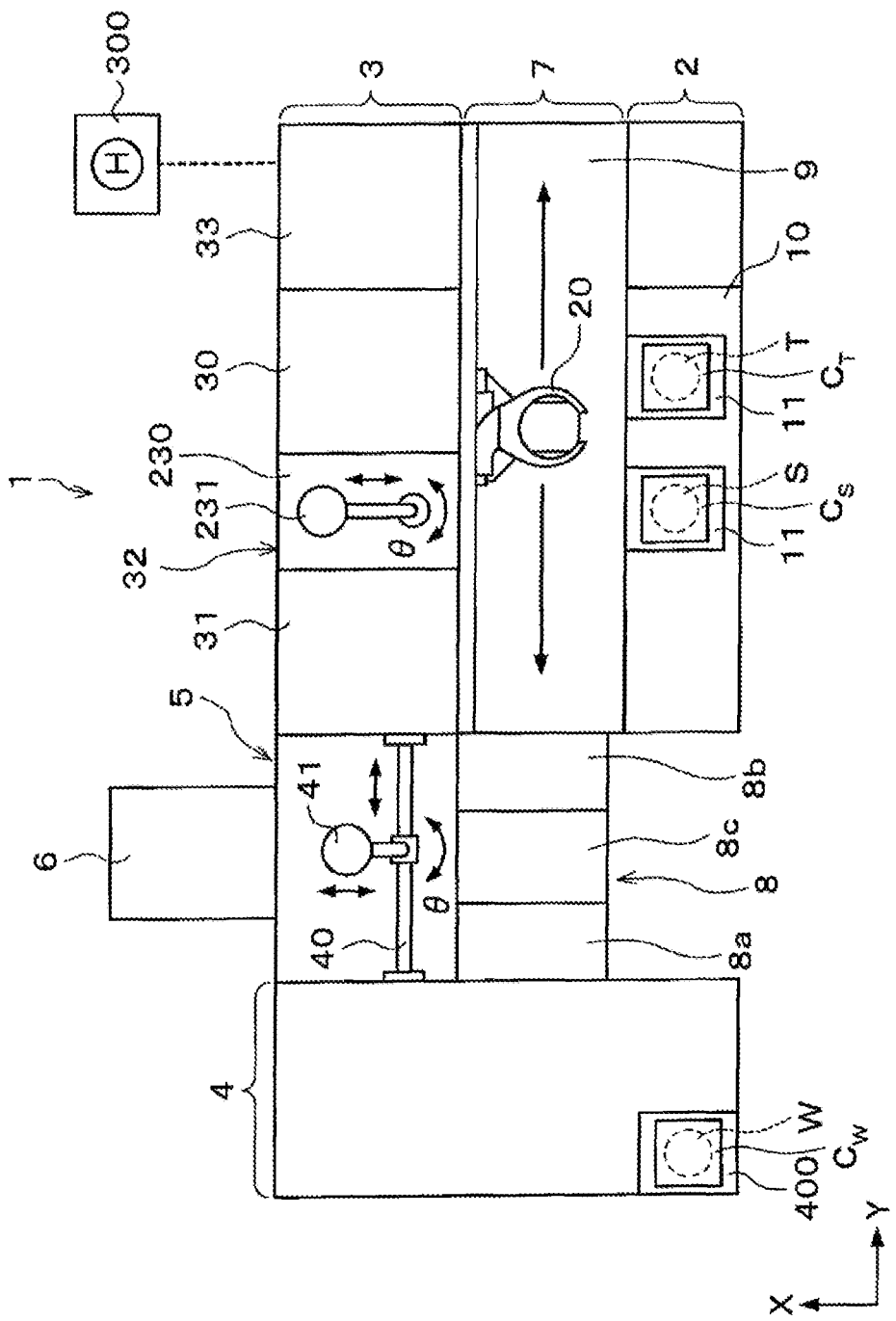
FIG. 16 is a view showing a position of a cassette loading table which collects a wafer to be processed in another embodiment.

While in the above embodiments, the cassette $C_W$ configured to accommodate the wafers to be processed W after the processing has been described to be disposed in the carry-in/carry-out station 2, the present disclosure is not limited thereto. As an example, as shown in FIG. 16, a loading table 400 on which the cassette $C_W$ is loaded may be disposed in the post-treatment station 4. This configuration allows the post-treatment station 4 to directly collect a finally processed wafer W therein, without transferring the finally processed wafer W to the carry-in/carry-out station 2. Further, since the pressure within the post-treatment station 4 is set to be higher than those of the other stations, there is no apprehension of dust entering the post-treatment station 4 from other stations. This makes it possible to collect the finally processed wafer W while maintaining a clean state.

In some embodiments, a configuration as shown in FIG. 17 may be employed as a modified example of FIG. 8. Differences between the configurations of FIG. 17 and FIG. 8 will be described. In FIG. 17, the cleaning device 31 does not contain an opening through which the wafer to be processed W passes at a sidewall facing the transfer station 7. In the cleaning device 31, openings through which the wafer to be processed W passes are formed at only sidewalls facing the transfer unit 32 and the interface station 5. Carrying the wafer to be processed W in and out of the cleaning device 31 is performed through the two openings of the transfer unit 32 or the transfer mechanism 41. This configuration makes it possible to simplify a configuration of the cleaning device 31 shown in FIG. 17 compared with that of the device shown in FIG. 8, thus improving reliability of the device.

In some embodiments, a shutter configured to open/close the openings may be installed in the openings. Alternatively, the openings may be always in an open state instead of installing the shutter.

Next, the reason that the porous chuck is used will be described. The wafer to be processed W is ground by a grinder so as to further slim a thickness thereof. This grinding process is then followed by the peeling process in the peeling system 1. In the peeling process, a thickness of the wafer to be processed W is, for example, about 40 μm. When peeling off the wafer to be processed W, the substantially entire region thereof should be held. Otherwise, after the peeling process, the wafer to be processed W would be warped and rounded like, e.g., a rolled paper. Addressing this problem requires the porous chuck which adsorbs the substantially entire region of the wafer to be processed W.

Next, the reason that the Bernoulli chuck is used as the transfer mechanism for the wafer to be processed W will be described. When the wafer to be processed W is subjected to the peeling process, the bonding surface $W_J$ thereof is exposed, and the adhesive G is attached onto the exposed bonding surface $W_J$. When the transfer mechanism transfers the wafer to be processed W while holding the bonding surface $W_J$ thereof in a contact manner, the adhesive G may be attached onto the transfer mechanism, thereby making the transfer mechanism dirty. As such, the Bernoulli chuck is used as a holding unit for holding the wafer to be processed W. The Bernoulli chuck is capable of holding the wafer to be processed W in a state where it floats from the Bernoulli chuck (in a contactless manner). Therefore, the adhesive G is not attached to the Bernoulli chuck and does not make the transfer mechanism dirty. In some embodiments, the Bernoulli chuck may be formed in any shape as long as it can hold the substantially entire region of one surface of the substrate in order to prevent the warpage from occurring in the wafer to be processed W.

Further, after the wafer to be processed W is separated from the support wafer S, in order to prevent the warpage from occurring in the wafer to be processed W, the substantially entire region of one surface of the wafer to be processed W always needs to be held by the aforementioned porous chuck or Bernoulli chuck. For example, even when the wafer to be processed W is transferred between the porous chuck and the Bernoulli chuck, any one of the chucks necessarily hold the wafer to be processed W over the entire surface thereof. In some embodiments, in the post-treatment station 4, the wafer to be processed W may be fixed to a frame body for preventing the warpage.

Furthermore, some portions of the above embodiments may be combined with each other, while obtaining the same operation and effects as the above embodiments.

Although preferable embodiments of the present disclosure have been described above with reference to the accompanying drawings, the present disclosure is not limited to the embodiments. It should be understood that various changes and modifications are readily apparent to those skilled in the art within the scope of the spirit as set forth in the claims, and those should also be covered by the technical scope of the present disclosure. The present disclosure is not limited to the embodiments but can take various aspects. The present disclosure may be applied to other various substrates including an FPD (flat panel display), a mask reticle for a photomask and so on, in addition to the wafers.

EXPLANATION OF REFERENCE NUMERALS 1 peeling system
2 carry-in/carry-out station
3 peeling process station
4 post-treatment station
5 interface station
6 inspection device
7 transfer station
8 cleaning device
9 wafer transfer region
20 transfer mechanism
30 peeling device
31 first cleaning device
32 transfer unit
33 second cleaning device
41 transfer mechanism
100 housing
110 first holding unit
111 second holding unit
124 heating mechanism
141 heating mechanism
150 moving mechanism
151 vertical moving unit
152 horizontal moving unit
190 porous chuck
230 transfer region
231 transfer mechanism
232 Bernoulli chuck
300 control unit
310 post-treatment station
320 peeling system
G adhesive
S support wafer
T overlapped wafer
W wafer to be processed

What is claimed is:

1. A peeling system for peeling off a substrate to be processed and a support substrate from an overlapped substrate, the overlapped substrate being formed by bonding the substrate to be processed and the support substrate by an adhesive, the peeling system comprising:
a peeling process station configured to perform a predetermined process on the substrate to be processed, the support substrate and the overlapped substrate;
a carry-in/carry-out station configured to carry at least one of the substrate to be processed, the support substrate and the overlapped substrate in and out of the peeling process station; and
a transfer station configured to transfer the at least one of the substrate to be processed, the support substrate and the overlapped substrate between the peeling process station and the carry-in/carry-out station,
wherein the peeling process station includes:
a peeling device configured to peel off the substrate to be processed and the support substrate from the overlapped substrate;
a first cleaning device configured to clean the substrate to be processed which is peeled by the peeling device;
a second cleaning device configured to clean the support substrate which is peeled by the peeling device; and
a transfer device configured to transfer the cleaned substrate to be processed between the peeling device and the first cleaning device,
wherein a pressure within the transfer station is higher than a pressure within the peeling device, a pressure within the first cleaning device, and a pressure within the second cleaning device, and
wherein a pressure within the transfer device is higher than the pressure within the peeling device and the pressure within the first cleaning device.

2. The peeling system of claim 1, further comprising: an interface station configured to transfer the substrate to be processed between the peeling process station and a post-treatment station, the post-treatment station being configured to perform a predetermined post-treatment on the substrate to be processed which is peeled by the peeling process station,
wherein a pressure within the interface station is lower than a pressure within the post-treatment station and is higher than a pressure within the peeling process station.

3. The peeling system of claim 2, further comprising: an inspection device provided adjacent to the interface station and configured to inspect the substrate to be processed,
wherein a pressure within the inspection device is higher than the pressure within the interface station.

4. The peeling system of claim 3, further comprising:
a third cleaning device provided adjacent to the interface station, and configured to clean the substrate inspected by the inspection device after the inspection device inspects the substrate to be processed,
wherein a pressure within the third cleaning device is lower than the pressure within the interface station.

5. The peeling system of claim 4, wherein the third cleaning device includes a bonding surface cleaning unit configured to clean a bonding surface of the substrate to be processed, a non-bonding surface cleaning unit configured to clean a non-bonding surface of the substrate to be processed, and an inverting unit configured to invert front and rear surfaces of the substrate to be processed.

6. The peeling system of claim 2, wherein a normal overlapped wafer including a normal wafer to be processed and an abnormal overlapped wafer including an abnormal wafer to be processed are loaded in the carry-in/carry-out station, the abnormal wafer including a defect,
wherein the peeling system comprises:
a control unit configured to control the interface station and the transfer station to transfer the normal wafer to be processed which is cleaned by the first cleaning device to the post-treatment station and to transfer the abnormal wafer to be processed which is cleaned by the first cleaning device to the carry-in/carry-out station.

7. The peeling system of claim 1, wherein the peeling device includes:
a first holding unit equipped with a heating mechanism for heating the substrate to be processed and configured to hold the substrate to be processed;
a second holding unit equipped with a heating mechanism for heating the support substrate and configured to hold the support substrate; and
a moving mechanism configured to move at least the first holding unit or the second holding unit relative to each other in a horizontal direction.

8. The peeling system of claim 1, wherein the transfer device includes a transfer mechanism configured to hold and transfer the substrate to be processed using a Bernoulli chuck.

9. The peeling system of claim 1, wherein the first cleaning device includes a porous chuck configured to hold the substrate to be processed.

10. The peeling system of claim 1, wherein the transfer station is configured to further transfer the substrate to be processed between the peeling process station and a post-treatment station configured to perform a predetermined post-treatment on the substrate to be processed which is peeled by the peeling process station, and wherein the pressure within the transfer station is higher than a pressure within the post-treatment station.

11. A method of peeling off a substrate to be processed and a support substrate from an overlapped substrate using a peeling system, the overlapped substrate being formed by bonding the substrate to be processed and the support substrate by an adhesive, wherein the peeling system includes:
a peeling process station provided with: a peeling device configured to peel off the substrate to be processed and the support substrate from the overlapped substrate; a first cleaning device configured to clean the substrate to be processed which is peeled by the peeling device; and a second cleaning device configured to clean the support substrate which is peeled by the peeling device;
a carry-in/carry-out station configured to carry at least one of the substrate to be processed, the support substrate or the overlapped substrate in and out of the peeling process station; and
a transfer station configured to transfer the at least one of the substrate to be processed, the support substrate or the overlapped substrate between the peeling process station and the carry-in/carry-out station,
the method comprising:
peeling, by the peeling device, the substrate to be processed and the support substrate from the overlapped substrate;
cleaning, by the first cleaning device, the substrate to be processed which is peeled by the peeling process;
cleaning, by the second cleaning device, the support substrate which is peeled by the peeling process; and
transferring, by a transfer device, the cleaned substrate to be processed between the peeling device and the first cleaning device,
wherein a pressure within the transfer station is higher than a pressure within the peeling device, a pressure within the first cleaning device and a pressure within the second cleaning device, and
wherein a pressure within the transfer device is higher than the pressure within the peeling device and the pressure within the first cleaning device.

12. The method of claim 11, wherein the peeling system includes an interface station configured to transfer the substrate to be processed between the peeling process station and a post-treatment station configured to perform a predetermined post-treatment on the substrate to be processed which is peeled by the peeling process station, the method comprises:
performing, in the post-treatment station, a post-treatment on the substrate to be processed after the first cleaning process, and
wherein a pressure within the interface station is lower than a pressure within the post-treatment station and is higher than a pressure within the peeling process station.

13. The method of claim 12, wherein the peeling system includes an inspection device provided adjacent to the interface station and configured to inspect the substrate to be processed, the method comprises:
inspecting the substrate to be processed after cleaning by the first cleaning device and before post-treating, and
wherein a pressure within the inspection device is higher than the pressure within the interface station.

14. The method of claim 13, wherein the peeling system includes a third cleaning device provided adjacent to the interface station and configured to clean the substrate inspected by the inspection device, the method comprises:
cleaning the substrate to be processed after inspecting and before post-treating, and
wherein a pressure within the third cleaning device after inspection is lower than the pressure within the interface station.

15. The method of claim 11, wherein a normal overlapped wafer including a normal wafer to be processed and an abnormal overlapped wafer including an abnormal wafer to be processed are loaded in the carry-in/carry-out station, the abnormal wafer including a defect, the method comprises:
performing, after cleaning by the first cleaning device, the post-treatment on the normal wafer to be processed; and
transferring, after cleaning by the first cleaning device, the abnormal wafer to be processed to the carry-in/carry-out station.

16. The method of claim 11, wherein the transfer station is configured to further transfer the substrate to be processed between the peeling process station and a post-treatment station configured to perform a predetermined post-treatment on the substrate to be processed which is peeled by the peeling process station, the method comprises:
performing, after cleaning by the first cleaning device, in the post-treatment station, a post-treatment on the substrate to be processed, and
wherein the pressure within the transfer station is higher than a pressure within the post-treatment station.

17. The method of claim 11, wherein the peeling device includes a first holding unit equipped with a heating mechanism for heating the substrate to be processed and configured to hold the substrate to be processed; a second holding unit equipped with a heating mechanism for heating the support substrate and configured to hold the support substrate; and a moving mechanism configured to move at least one of the first holding unit and the second holding unit relative to each other in a horizontal direction, wherein peeling includes:
moving at least one of the first holding unit and the second holding unit relative to each other in the horizontal direction, while heating the substrate to be processed held by the first holding unit and the support substrate held by the second holding unit; and
peeling the substrate to be processed and the support substrate from each other.

18. The method of claim 17, wherein the moving mechanism is configured to move the at least one of first holding unit and the second holding unit relative to each other in a vertical direction, wherein peeling includes:
moving the at least one of the first holding unit and the second holding unit relative to each other in the horizontal and vertical directions; and
peeling the substrate to be processed and the support substrate from each other.

19. A computer readable storage medium having a control program operating on a computer stored thereon, wherein the control program, when executed, causes the computer to perform a method of peeling off a substrate to be processed and a support substrate from an overlapped substrate using a peeling system, the overlapped substrate being formed by bonding the substrate to be processed and the support substrate by an adhesive, wherein the peeling system comprises:

a peeling process station provided with a peeling device configured to peel off the substrate to be processed and the support substrate from the overlapped substrate; a first cleaning device configured to clean the substrate to be processed which is peeled by the peeling device; and a second cleaning device configured to clean the support substrate which is peeled by the peeling device;

a carry-in/carry-out station configured to carry at least one of the substrate to be processed, the support substrate and the overlapped substrate in and out of the peeling process station; and a transfer station configured to transfer the at least one of the substrate to be processed, the support substrate and the overlapped substrate between the peeling process station and the carry-in/carry-out station, wherein the method comprises:

peeling off, by the peeling device, the substrate to be processed and the support substrate from the overlapped substrate;

cleaning, by the first cleaning device, the substrate to be processed which is peeled by the peeling process;

cleaning, by the second cleaning device, the support substrate which is peeled by the peeling process; and transferring, by a transfer device, the cleaned substrate to be processed between the peeling device and the first cleaning device, wherein a pressure within the transfer station is higher than a pressure within the peeling device, a pressure within the first cleaning device and a pressure within the second cleaning device, and wherein a pressure within the transfer device is higher than the pressure within the peeling device and the pressure within the first cleaning device.

* * * * *